(12) United States Patent
Campbell et al.

(10) Patent No.: US 7,449,899 B2
(45) Date of Patent: Nov. 11, 2008

(54) PROBE FOR HIGH FREQUENCY SIGNALS

(75) Inventors: Richard L. Campbell, Portland, OR (US); Michael Andrews, Hillsboro, OR (US); Lynh Bui, Tigard, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 179 days.

(21) Appl. No.: 11/410,783

(22) Filed: Apr. 24, 2006

(65) Prior Publication Data

US 2006/0279299 A1 Dec. 14, 2006

Related U.S. Application Data

(60) Provisional application No. 60/688,821, filed on Jun. 8, 2005.

(51) Int. Cl.
*G01R 31/02* (2006.01)
(52) U.S. Cl. .................................. 324/754; 324/761
(58) Field of Classification Search ................ None
See application file for complete search history.

(56) References Cited

U.S. PATENT DOCUMENTS

| | | | |
|---|---|---|---|
| 491,783 A | 2/1893 | Moyer |
| 1,337,866 A | 4/1920 | Whitacker |
| 2,142,625 A | 1/1939 | Zoethout |
| 2,376,101 A | 5/1945 | Tyzzer |
| 2,389,668 A | 11/1945 | Johnson |
| 2,545,258 A | 3/1951 | Cailloux |
| 2,762,234 A | 9/1956 | Dodd |
| 2,901,696 A | 8/1959 | Möllfors |
| 2,921,276 A | 1/1960 | Fubini |
| 3,176,091 A | 3/1965 | Hanson et al. |
| 3,193,712 A | 7/1965 | Harris |
| 3,218,584 A | 11/1965 | Ayer |
| 3,230,299 A | 1/1966 | Radziekowski |
| 3,262,593 A | 7/1966 | Hainer |
| 3,396,598 A | 8/1968 | Grispo |
| 3,401,126 A | 9/1968 | Miller et al. |
| 3,429,040 A | 2/1969 | Miller |
| 3,445,770 A | 5/1969 | Harmon |
| 3,484,679 A | 12/1969 | Hodgson et al. |
| 3,541,222 A | 11/1970 | Parks et al. |
| 3,561,280 A | 2/1971 | MacPhee et al. |
| 3,573,617 A | 4/1971 | Randolph et al. |

(Continued)

FOREIGN PATENT DOCUMENTS

CH 607 045 11/1978

(Continued)

OTHER PUBLICATIONS

Basu, Saswata and Gleason, Reed "A Membrane Quadrant Probe for R&D Applications" Technical Document—Jun. 1997.

(Continued)

*Primary Examiner*—Vinh P Nguyen
(74) *Attorney, Agent, or Firm*—Chernoff, Vilhauer, McClung & Stenzel

(57) ABSTRACT

A high frequency probe has contact tips located within the periphery of a terminal section of a coaxial cable and shielded by a ground conductor of the coaxial cable.

20 Claims, 5 Drawing Sheets

U.S. PATENT DOCUMENTS

| | | |
|---|---|---|
| 3,596,228 A | 7/1971 | Reed et al. |
| 3,609,539 A | 9/1971 | Gunthert |
| 3,611,199 A | 10/1971 | Safran |
| 3,619,780 A | 11/1971 | Hoeks |
| 3,622,915 A | 11/1971 | Davo |
| 3,634,807 A | 1/1972 | Grobe et al. |
| 3,648,169 A | 3/1972 | Wiesler |
| 3,654,585 A | 4/1972 | Wickersham |
| 3,662,318 A | 5/1972 | Decuyper |
| 3,680,037 A | 7/1972 | Nellis et al. |
| 3,686,624 A | 8/1972 | Napoli et al. |
| 3,700,998 A | 10/1972 | Lee et al. |
| 3,705,379 A | 12/1972 | Bogar |
| 3,710,251 A | 1/1973 | Hagge et al. |
| 3,714,572 A | 1/1973 | Ham et al. |
| 3,725,829 A | 4/1973 | Brown |
| 3,740,900 A | 6/1973 | Youmans et al. |
| 3,766,470 A | 10/1973 | Hay et al. |
| 3,806,801 A | 4/1974 | Bove |
| 3,810,016 A | 5/1974 | Chayka et al. |
| 3,829,076 A | 8/1974 | Sofy |
| 3,833,852 A | 9/1974 | Schoch |
| 3,839,672 A | 10/1974 | Anderson |
| 3,849,728 A | 11/1974 | Evans |
| 3,858,212 A | 12/1974 | Tompkins et al. |
| 3,862,790 A | 1/1975 | Davies et al. |
| 3,866,093 A | 2/1975 | Kusters et al. |
| 3,867,698 A | 2/1975 | Beltz et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,971,610 A | 7/1976 | Buchoff et al. |
| 3,976,959 A | 8/1976 | Gaspari |
| 3,992,073 A | 11/1976 | Buchoff et al. |
| 4,001,685 A | 1/1977 | Roch |
| 4,008,900 A | 2/1977 | Khoshaba |
| 4,009,456 A | 2/1977 | Hopfer |
| 4,027,935 A | 6/1977 | Byrnes et al. |
| 4,035,723 A | 7/1977 | Kvaternik |
| 4,038,599 A | 7/1977 | Bove et al. |
| 4,038,894 A | 8/1977 | Knibbe et al. |
| 4,049,252 A | 9/1977 | Bell |
| 4,063,195 A | 12/1977 | Abrams et al. |
| 4,066,943 A | 1/1978 | Roch |
| 4,072,576 A | 2/1978 | Arwin et al. |
| 4,074,201 A | 2/1978 | Lennon |
| 4,093,988 A | 6/1978 | Scott |
| 4,099,120 A | 7/1978 | Aksu |
| 4,115,735 A | 9/1978 | Stanford |
| 4,116,523 A | 9/1978 | Coberly |
| 4,123,706 A | 10/1978 | Roch |
| 4,124,787 A | 11/1978 | Aamoth et al. |
| 4,135,131 A | 1/1979 | Larsen et al. |
| 4,151,465 A | 4/1979 | Lenz |
| 4,161,692 A | 7/1979 | Tarzwell |
| 4,177,421 A | 12/1979 | Thornburg |
| 4,184,133 A | 1/1980 | Gehle |
| 4,184,729 A | 1/1980 | Parks et al. |
| 4,216,467 A | 8/1980 | Colston |
| 4,225,819 A | 9/1980 | Grau et al. |
| 4,232,398 A | 11/1980 | Gould et al. |
| 4,251,772 A | 2/1981 | Worsham et al. |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | del Rio |
| 4,284,682 A | 8/1981 | Tshirch et al. |
| 4,287,473 A | 9/1981 | Sawyer |
| 4,302,146 A | 11/1981 | Finlayson et al. |
| 4,306,235 A | 12/1981 | Christmann |
| 4,312,117 A | 1/1982 | Robillard et al. |
| 4,327,180 A | 4/1982 | Chen |
| 4,330,783 A | 5/1982 | Toia |
| 4,340,860 A | 7/1982 | Teeple, Jr. |
| 4,346,355 A | 8/1982 | Tsukii |
| 4,357,575 A | 11/1982 | Uren et al. |
| 4,375,631 A | 3/1983 | Goldberg |
| 4,376,920 A | 3/1983 | Smith |
| 4,383,217 A | 5/1983 | Shiell |
| 4,401,945 A | 8/1983 | Juengel |
| 4,425,395 A | 1/1984 | Negishi et al. |
| 4,453,142 A | 6/1984 | Murphy |
| 4,468,629 A | 8/1984 | Choma, Jr. |
| 4,487,996 A | 12/1984 | Rabinowitz et al. |
| 4,515,133 A | 5/1985 | Roman |
| 4,515,439 A | 5/1985 | Esswein |
| 4,528,504 A | 7/1985 | Thornton, Jr. et al. |
| 4,552,033 A | 11/1985 | Marzhauser |
| 4,567,321 A | 1/1986 | Harayama |
| 4,588,950 A | 5/1986 | Henley |
| 4,593,243 A | 6/1986 | Lao et al. |
| 4,621,169 A | 11/1986 | Petinelli et al. |
| 4,626,618 A | 12/1986 | Takaoka et al. |
| 4,641,659 A | 2/1987 | Sepponen |
| 4,642,417 A | 2/1987 | Ruthrof et al. |
| 4,646,005 A | 2/1987 | Ryan |
| 4,649,339 A | 3/1987 | Grangroth et al. |
| 4,651,115 A | 3/1987 | Wu |
| 4,652,082 A | 3/1987 | Warner |
| 4,663,840 A | 5/1987 | Ubbens |
| 4,669,805 A | 6/1987 | Kosugi et al. |
| 4,673,839 A | 6/1987 | Veenendaal |
| 4,684,883 A | 8/1987 | Ackerman et al. |
| 4,684,884 A | 8/1987 | Soderlund |
| 4,685,150 A | 8/1987 | Maier |
| 4,691,163 A | 9/1987 | Blass et al. |
| 4,696,544 A | 9/1987 | Costella |
| 4,697,143 A | 9/1987 | Lockwood et al. |
| 4,705,447 A | 11/1987 | Smith |
| 4,706,050 A | 11/1987 | Andrews |
| 4,707,657 A | 11/1987 | Boegh-Petersen |
| 4,711,563 A | 12/1987 | Lass |
| 4,713,347 A | 12/1987 | Mitchell et al. |
| 4,714,873 A | 12/1987 | McPherson et al. |
| 4,722,846 A | 2/1988 | Abe et al. |
| 4,725,793 A | 2/1988 | Igarashi |
| 4,727,319 A | 2/1988 | Shahriary |
| 4,727,391 A | 2/1988 | Tajima et al. |
| 4,727,637 A | 3/1988 | Buckwitz et al. |
| 4,734,641 A | 3/1988 | Byrd, Jr. et al. |
| 4,739,259 A | 4/1988 | Hadwin et al. |
| 4,740,764 A | 4/1988 | Gerlack |
| 4,742,571 A | 5/1988 | Letron |
| 4,744,041 A | 5/1988 | Strunk et al. |
| 4,746,857 A | 5/1988 | Sakai et al. |
| 4,749,942 A | 6/1988 | Sang et al. |
| 4,754,239 A | 6/1988 | Sedivec |
| 4,755,746 A | 7/1988 | Mallory et al. |
| 4,755,747 A | 7/1988 | Sato |
| 4,755,874 A | 7/1988 | Esrig et al. |
| 4,757,255 A | 7/1988 | Margozzi |
| 4,764,723 A | 8/1988 | Strid |
| 4,766,384 A | 8/1988 | Kleinberg et al. |
| 4,772,846 A | 9/1988 | Reeds |
| 4,780,670 A | 10/1988 | Cherry |
| 4,783,625 A | 11/1988 | Harry et al. |
| 4,788,851 A | 12/1988 | Brault |
| 4,791,363 A | 12/1988 | Logan |
| 4,793,814 A | 12/1988 | Zifcak et al. |
| 4,795,962 A | 1/1989 | Yanagawa et al. |
| 4,805,627 A | 2/1989 | Klingenbeck et al. |
| 4,810,981 A | 3/1989 | Herstein |
| 4,812,754 A | 3/1989 | Tracy et al. |

| | | | | | |
|---|---|---|---|---|---|
| 4,818,059 A | 4/1989 | Kakii et al. | 5,136,237 A | 8/1992 | Smith et al. |
| 4,827,211 A | 5/1989 | Strid et al. | 5,138,289 A | 8/1992 | McGrath |
| 4,831,494 A | 5/1989 | Arnold et al. | 5,142,224 A | 8/1992 | Smith et al. |
| 4,835,495 A | 5/1989 | Simonutti | 5,145,552 A | 9/1992 | Yoshizawa et al. |
| 4,837,507 A | 6/1989 | Hechtman | 5,148,131 A | 9/1992 | Amboss et al. |
| 4,839,587 A | 6/1989 | Flatley et al. | 5,159,264 A | 10/1992 | Anderson |
| 4,849,689 A | 7/1989 | Gleason et al. | 5,159,267 A | 10/1992 | Anderson |
| 4,853,624 A | 8/1989 | Rabjohn | 5,159,752 A | 11/1992 | Mahant-Shetti et al. |
| 4,853,627 A | 8/1989 | Gleason et al. | 5,160,883 A | 11/1992 | Blanz |
| 4,858,160 A | 8/1989 | Strid et al. | 5,164,319 A | 11/1992 | Hafeman et al. |
| 4,859,989 A | 8/1989 | McPherson | 5,166,606 A | 11/1992 | Blanz |
| 4,864,227 A | 9/1989 | Sato | 5,172,049 A | 12/1992 | Kiyokawa et al. |
| 4,871,883 A | 10/1989 | Guiol | 5,172,050 A | 12/1992 | Swapp |
| 4,871,964 A | 10/1989 | Boll et al. | 5,172,051 A | 12/1992 | Zamborelli |
| 4,888,550 A | 12/1989 | Reid | 5,177,438 A | 1/1993 | Littlebury et al. |
| 4,891,584 A | 1/1990 | Kamieniecki et al. | 5,180,977 A | 1/1993 | Huff |
| 4,893,914 A | 1/1990 | Hancock et al. | 5,187,443 A | 2/1993 | Bereskin |
| 4,894,612 A | 1/1990 | Drake et al. | 5,198,752 A | 3/1993 | Miyata et al. |
| 4,899,126 A | 2/1990 | Yamada | 5,198,753 A | 3/1993 | Hamburgen |
| 4,899,998 A | 2/1990 | Feramachi | 5,202,558 A | 4/1993 | Barker |
| 4,901,012 A | 2/1990 | Gloanec et al. | 5,202,648 A | 4/1993 | McCandless |
| 4,904,933 A | 2/1990 | Snyder et al. | 5,207,585 A | 5/1993 | Byrnes et al. |
| 4,904,935 A | 2/1990 | Calma et al. | 5,214,243 A | 5/1993 | Johnson |
| 4,906,920 A | 3/1990 | Huff et al. | 5,214,374 A | 5/1993 | St. Onge |
| 4,908,570 A | 3/1990 | Gupta et al. | 5,225,037 A | 7/1993 | Eldu et al. |
| 4,912,399 A | 3/1990 | Greub et al. | 5,227,730 A | 7/1993 | King et al. |
| 4,916,002 A | 4/1990 | Carver | 5,232,789 A | 8/1993 | Platz et al. |
| 4,916,398 A | 4/1990 | Rath | 5,233,197 A | 8/1993 | Bowman et al. |
| 4,918,373 A | 4/1990 | Newberg | 5,233,306 A | 8/1993 | Misra |
| 4,918,383 A | 4/1990 | Huff et al. | 5,245,292 A | 9/1993 | Milesky et al. |
| 4,922,128 A | 5/1990 | Dhong et al. | 5,266,889 A | 11/1993 | Harwood et al. |
| 4,922,186 A | 5/1990 | Tsuchiya et al. | 5,266,963 A | 11/1993 | Carter |
| 4,922,912 A | 5/1990 | Watanabe | 5,267,088 A | 11/1993 | Nomura |
| 4,926,172 A | 5/1990 | Gorsek | 5,270,664 A | 12/1993 | McMurty et al. |
| 4,929,893 A | 5/1990 | Sato et al. | 5,274,336 A | 12/1993 | Crook |
| 4,970,386 A | 11/1990 | Buck | 5,280,156 A | 1/1994 | Niori et al. |
| 4,972,073 A | 11/1990 | Lessing | 5,289,117 A | 2/1994 | Van Loan et al. |
| 4,975,638 A | 12/1990 | Evans et al. | 5,293,175 A | 3/1994 | Hemmie |
| 4,980,637 A | 12/1990 | Huff et al. | 5,298,972 A | 3/1994 | Heffner |
| 4,983,910 A | 1/1991 | Majidi-Ahy et al. | 5,304,924 A | 4/1994 | Yamano et al. |
| 4,987,100 A | 1/1991 | McBride et al. | 5,313,157 A | 5/1994 | Pasiecznik, Jr. |
| 4,988,062 A | 1/1991 | London | 5,315,237 A | 5/1994 | Iwakura et al. |
| 4,991,290 A | 2/1991 | MacKay | 5,316,435 A | 5/1994 | Monzingo |
| 4,998,062 A | 3/1991 | Ikeda | 5,317,656 A | 5/1994 | Moslehi et al. |
| 4,998,063 A | 3/1991 | Miller | 5,321,352 A | 6/1994 | Takebuchi |
| 5,001,423 A | 3/1991 | Abrami | 5,321,453 A | 6/1994 | Mori et al. |
| 5,003,253 A | 3/1991 | Majidi-Ahy et al. | 5,326,412 A | 7/1994 | Schreiber et al. |
| 5,012,186 A | 4/1991 | Gleason | 5,334,931 A | 8/1994 | Clarke et al. |
| 5,020,219 A | 6/1991 | Leedy | 5,347,204 A | 9/1994 | Gregory et al. |
| 5,021,186 A | 6/1991 | Ota et al. | 5,355,079 A | 10/1994 | Evans et al. |
| 5,030,907 A | 7/1991 | Yih et al. | 5,357,211 A | 10/1994 | Bryson et al. |
| 5,041,782 A | 8/1991 | Marzan | 5,360,312 A | 11/1994 | Mozingo |
| 5,045,781 A | 9/1991 | Gleason et al. | 5,361,049 A | 11/1994 | Rubin et al. |
| 5,059,898 A | 10/1991 | Barsotti et al. | 5,363,050 A | 11/1994 | Guo et al. |
| 5,061,192 A | 10/1991 | Chapin et al. | 5,367,165 A | 11/1994 | Toda et al. |
| 5,061,823 A | 10/1991 | Carroll | 5,369,368 A | 11/1994 | Kassen et al. |
| 5,066,357 A | 11/1991 | Smyth, Jr. et al. | 5,371,654 A | 12/1994 | Beaman et al. |
| 5,069,628 A | 12/1991 | Crumly | 5,373,231 A | 12/1994 | Boll et al. |
| 5,082,627 A | 1/1992 | Stanbro | 5,374,938 A | 12/1994 | Hatazawa et al. |
| 5,084,671 A | 1/1992 | Miyata et al. | 5,376,790 A | 12/1994 | Linker et al. |
| 5,089,774 A | 2/1992 | Nakano | 5,383,787 A | 1/1995 | Switky et al. |
| 5,091,692 A | 2/1992 | Ohno et al. | 5,389,885 A | 2/1995 | Swart |
| 5,091,732 A | 2/1992 | Mileski et al. | 5,395,253 A | 3/1995 | Crumly |
| 5,095,891 A | 3/1992 | Reitter | 5,397,855 A | 3/1995 | Ferlier |
| 5,097,101 A | 3/1992 | Trobough | 5,404,111 A | 4/1995 | Mori et al. |
| 5,097,207 A | 3/1992 | Blanz | 5,408,188 A | 4/1995 | Katoh |
| 5,101,453 A | 3/1992 | Rumbaugh | 5,408,189 A | 4/1995 | Swart et al. |
| 5,107,076 A | 4/1992 | Bullock et al. | 5,412,330 A | 5/1995 | Ravel et al. |
| 5,116,180 A | 5/1992 | Fung et al. | 5,412,866 A | 5/1995 | Woith et al. |
| 5,126,286 A | 6/1992 | Chance | 5,414,565 A | 5/1995 | Sullivan et al. |
| 5,126,696 A | 6/1992 | Grote et al. | 5,422,574 A | 6/1995 | Kister |
| 5,133,119 A | 7/1992 | Afshari et al. | 5,430,813 A | 7/1995 | Anderson et al. |
| 5,134,365 A | 7/1992 | Okubo et al. | 5,441,690 A | 8/1995 | Ayola-Esquilin et al. |

| | | | | | |
|---|---|---|---|---|---|
| 5,451,884 A | 9/1995 | Sauerland | 5,672,816 A | 9/1997 | Park et al. |
| 5,453,404 A | 9/1995 | Leedy | 5,675,499 A | 10/1997 | Lee et al. |
| 5,457,398 A | 10/1995 | Schwindt et al. | 5,675,932 A | 10/1997 | Mauney |
| 5,463,324 A | 10/1995 | Wardwell et al. | 5,676,360 A | 10/1997 | Boucher et al. |
| 5,467,024 A | 11/1995 | Swapp | 5,678,210 A | 10/1997 | Hannah |
| 5,469,324 A | 11/1995 | Henderson et al. | 5,685,232 A | 11/1997 | Inoue |
| 5,475,316 A | 12/1995 | Hurley et al. | 5,686,317 A | 11/1997 | Akram et al. |
| 5,476,211 A | 12/1995 | Khandros | 5,686,960 A | 11/1997 | Sussman et al. |
| 5,477,011 A | 12/1995 | Singles et al. | 5,688,618 A | 11/1997 | Hulderman et al. |
| 5,478,748 A | 12/1995 | Akins, Jr. et al. | 5,700,844 A | 12/1997 | Hedrick et al. |
| 5,479,108 A | 12/1995 | Cheng | 5,704,355 A | 1/1998 | Bridges |
| 5,479,109 A | 12/1995 | Lau et al. | 5,715,819 A | 2/1998 | Svenson et al. |
| 5,481,196 A | 1/1996 | Nosov | 5,720,098 A | 2/1998 | Kister |
| 5,481,936 A | 1/1996 | Yanagisawa | 5,723,347 A | 3/1998 | Kirano et al. |
| 5,487,999 A | 1/1996 | Farnworth | 5,726,211 A | 3/1998 | Hedrick et al. |
| 5,488,954 A | 2/1996 | Sleva et al. | 5,728,091 A | 3/1998 | Payne et al. |
| 5,493,070 A | 2/1996 | Habu | 5,729,150 A | 3/1998 | Schwindt |
| 5,493,236 A | 2/1996 | Ishii et al. | 5,731,920 A | 3/1998 | Katsuragawa |
| 5,500,606 A | 3/1996 | Holmes | 5,742,174 A | 4/1998 | Kister et al. |
| 5,505,150 A | 4/1996 | James et al. | 5,744,971 A | 4/1998 | Chan et al. |
| 5,506,498 A | 4/1996 | Anderson et al. | 5,748,506 A | 5/1998 | Bockelman |
| 5,506,515 A | 4/1996 | Godshalk et al. | 5,751,153 A | 5/1998 | Bockelman |
| 5,507,652 A | 4/1996 | Wardwell | 5,751,252 A | 5/1998 | Phillips |
| 5,510,792 A | 4/1996 | Ono et al. | 5,756,021 A | 5/1998 | Hendrick et al. |
| 5,511,010 A | 4/1996 | Burns | 5,756,908 A | 5/1998 | Knollmeyer et al. |
| 5,512,835 A | 4/1996 | Rivera et al. | 5,764,070 A | 6/1998 | Pedder |
| 5,517,126 A | 5/1996 | Yamaguchi | 5,767,690 A | 6/1998 | Fujimoto |
| 5,521,518 A | 5/1996 | Higgins | 5,772,451 A | 6/1998 | Dozier, II et al. |
| 5,521,522 A | 5/1996 | Abe et al. | 5,773,780 A | 6/1998 | Eldridge et al. |
| 5,523,694 A | 6/1996 | Cole, Jr. | 5,777,485 A | 7/1998 | Tanaka et al. |
| 5,528,158 A | 6/1996 | Sinsheimer et al. | 5,785,538 A | 7/1998 | Beaman et al. |
| 5,530,372 A | 6/1996 | Lee et al. | 5,792,668 A | 8/1998 | Fuller et al. |
| 5,531,022 A | 7/1996 | Beaman et al. | 5,793,213 A | 8/1998 | Bockelman et al. |
| 5,532,608 A | 7/1996 | Behfar-Rad et al. | 5,794,133 A | 8/1998 | Kashima |
| 5,537,372 A | 7/1996 | Albrecht | 5,803,607 A | 9/1998 | Jones et al. |
| 5,539,323 A | 7/1996 | Davis, Jr. | 5,804,607 A | 9/1998 | Hedrick et al. |
| 5,539,676 A | 7/1996 | Yamaguchi | 5,804,982 A | 9/1998 | Lo et al. |
| 5,550,481 A | 8/1996 | Holmes et al. | 5,804,983 A | 9/1998 | Nakajima et al. |
| 5,561,378 A | 10/1996 | Bockelman et al. | 5,806,181 A | 9/1998 | Khandros et al. |
| 5,565,788 A | 10/1996 | Burr et al. | 5,807,107 A | 9/1998 | Bright et al. |
| 5,565,881 A | 10/1996 | Phillips et al. | 5,810,607 A | 9/1998 | Shih et al. |
| 5,569,591 A | 10/1996 | Kell et al. | 5,811,751 A | 9/1998 | Leona et al. |
| 5,571,324 A | 11/1996 | Sago et al. | 5,811,982 A | 9/1998 | Beaman et al. |
| 5,578,932 A | 11/1996 | Adamian | 5,813,847 A | 9/1998 | Eroglu |
| 5,583,445 A | 12/1996 | Mullen | 5,814,847 A | 9/1998 | Shihadeh |
| 5,584,120 A | 12/1996 | Roberts | 5,820,014 A | 10/1998 | Dozier, II et al. |
| 5,584,608 A | 12/1996 | Gillespie | 5,821,763 A | 10/1998 | Beaman et al. |
| 5,589,781 A | 12/1996 | Higgens et al. | 5,824,494 A | 10/1998 | Feldberg |
| 5,594,358 A | 1/1997 | Ishikawa et al. | 5,829,128 A | 11/1998 | Eldridge et al. |
| 5,600,256 A | 2/1997 | Woith et al. | 5,829,437 A | 11/1998 | Bridges |
| 5,601,740 A | 2/1997 | Eldridge et al. | 5,831,442 A | 11/1998 | Heigl |
| 5,610,529 A | 3/1997 | Schwindt | 5,832,601 A | 11/1998 | Eldridge et al. |
| 5,611,008 A | 3/1997 | Yap | 5,833,601 A | 11/1998 | Swartz et al. |
| 5,617,035 A | 4/1997 | Swapp | 5,838,160 A | 11/1998 | Beaman et al. |
| 5,621,333 A | 4/1997 | Long et al. | 5,841,288 A | 11/1998 | Meaney et al. |
| 5,621,400 A | 4/1997 | Corbi | 5,841,342 A | 11/1998 | Hegmann et al. |
| 5,623,213 A | 4/1997 | Liu et al. | 5,846,708 A | 12/1998 | Hollis et al. |
| 5,623,214 A | 4/1997 | Pasiecznik, Jr. | 5,847,569 A | 12/1998 | Ho et al. |
| 5,627,473 A | 5/1997 | Takami | 5,848,500 A | 12/1998 | Kirk |
| 5,628,057 A | 5/1997 | Phillips et al. | 5,852,232 A | 12/1998 | Samsavar et al. |
| 5,629,838 A | 5/1997 | Knight et al. | 5,852,871 A | 12/1998 | Khandros |
| 5,631,571 A | 5/1997 | Spaziani et al. | 5,854,608 A | 12/1998 | Leisten |
| 5,633,780 A | 5/1997 | Cronin | 5,864,946 A | 2/1999 | Eldridge et al. |
| 5,635,846 A | 6/1997 | Beaman et al. | 5,867,073 A | 2/1999 | Weinreb et al. |
| 5,642,298 A | 6/1997 | Mallory et al. | 5,869,326 A | 2/1999 | Hofmann |
| 5,644,248 A | 7/1997 | Fujimoto | 5,869,974 A | 2/1999 | Akram et al. |
| 5,653,939 A | 8/1997 | Hollis et al. | 5,874,361 A | 2/1999 | Collins et al. |
| 5,656,942 A | 8/1997 | Watts et al. | 5,876,082 A | 3/1999 | Kempf et al. |
| 5,659,421 A | 8/1997 | Rahmel et al. | 5,878,486 A | 3/1999 | Eldridge et al. |
| 5,666,063 A | 9/1997 | Abercrombie et al. | 5,879,289 A | 3/1999 | Yarush et al. |
| 5,669,316 A | 9/1997 | Faz et al. | 5,883,522 A | 3/1999 | O'Boyle |
| 5,670,322 A | 9/1997 | Eggers et al. | 5,883,523 A | 3/1999 | Ferland et al. |
| 5,670,888 A | 9/1997 | Cheng | 5,884,398 A | 3/1999 | Eldridge et al. |

| | | |
|---|---|---|
| 5,888,075 A | 3/1999 | Hasegawa et al. |
| 5,892,539 A | 4/1999 | Colvin |
| 5,896,038 A | 4/1999 | Budnaitis et al. |
| 5,900,737 A | 5/1999 | Graham et al. |
| 5,900,738 A | 5/1999 | Khandros et al. |
| 5,903,143 A | 5/1999 | Mochizuki et al. |
| 5,905,421 A | 5/1999 | Oldfield |
| 5,910,727 A | 6/1999 | Fujihara et al. |
| 5,912,046 A | 6/1999 | Eldridge et al. |
| 5,914,613 A | 6/1999 | Gleason et al. |
| 5,914,614 A | 6/1999 | Beaman et al. |
| 5,916,689 A | 6/1999 | Collins et al. |
| 5,917,707 A | 6/1999 | Khandros et al. |
| 5,923,180 A | 7/1999 | Botka et al. |
| 5,926,029 A | 7/1999 | Ference et al. |
| 5,926,951 A | 7/1999 | Khandros et al. |
| 5,940,965 A | 8/1999 | Uhling et al. |
| 5,944,093 A | 8/1999 | Viswanath |
| 5,945,836 A | 8/1999 | Sayre et al. |
| 5,949,383 A | 9/1999 | Hayes et al. |
| 5,949,579 A | 9/1999 | Baker |
| 5,959,461 A | 9/1999 | Brown et al. |
| 5,963,364 A | 10/1999 | Leong et al. |
| 5,966,645 A | 10/1999 | Davis |
| 5,970,429 A | 10/1999 | Martin |
| 5,973,504 A | 10/1999 | Chong |
| 5,974,662 A | 11/1999 | Eldridge et al. |
| 5,977,783 A | 11/1999 | Takayama et al. |
| 5,981,268 A | 11/1999 | Kovacs et al. |
| 5,982,166 A | 11/1999 | Mautz |
| 5,983,493 A | 11/1999 | Eldridge et al. |
| 5,993,611 A | 11/1999 | Moroney, III et al. |
| 5,994,152 A | 11/1999 | Khandros |
| 5,995,914 A | 11/1999 | Cabot |
| 5,996,102 A | 11/1999 | Haulin |
| 5,998,228 A | 12/1999 | Eldridge et al. |
| 5,998,768 A | 12/1999 | Hunter et al. |
| 5,998,864 A | 12/1999 | Khandros et al. |
| 5,999,268 A | 12/1999 | Yonezawa et al. |
| 6,001,760 A | 12/1999 | Katsuda et al. |
| 6,002,426 A | 12/1999 | Back et al. |
| 6,006,002 A | 12/1999 | Motok et al. |
| 6,013,586 A | 1/2000 | McGhee et al. |
| 6,019,612 A | 2/2000 | Hasegawa et al. |
| 6,023,103 A | 2/2000 | Chang et al. |
| 6,028,435 A | 2/2000 | Nikawa |
| 6,029,344 A | 2/2000 | Khandros et al. |
| 6,031,383 A | 2/2000 | Streib et al. |
| 6,032,356 A | 3/2000 | Eldridge et al. |
| 6,032,714 A | 3/2000 | Fenton |
| 6,033,935 A | 3/2000 | Dozier, II et al. |
| 6,034,533 A | 3/2000 | Tervo et al. |
| 6,037,785 A | 3/2000 | Higgins |
| 6,040,739 A | 3/2000 | Wedeen et al. |
| 6,042,712 A | 3/2000 | Mathieu |
| 6,043,563 A | 3/2000 | Eldridge et al. |
| 6,046,599 A | 4/2000 | Long et al. |
| 6,049,216 A | 4/2000 | Yang et al. |
| 6,049,976 A | 4/2000 | Khandros |
| 6,050,829 A | 4/2000 | Eldridge |
| 6,051,422 A | 4/2000 | Kovacs et al. |
| 6,052,653 A | 4/2000 | Mazur et al. |
| 6,054,651 A | 4/2000 | Fogel et al. |
| 6,054,869 A | 4/2000 | Hutton et al. |
| 6,059,982 A | 5/2000 | Palagonia et al. |
| 6,060,888 A | 5/2000 | Blackham et al. |
| 6,060,892 A | 5/2000 | Yamagata |
| 6,061,589 A | 5/2000 | Bridges et al. |
| 6,062,879 A | 5/2000 | Beaman et al. |
| 6,064,213 A | 5/2000 | Khandros et al. |
| 6,064,217 A | 5/2000 | Smith |
| 6,064,218 A | 5/2000 | Godfrey et al. |
| 6,066,911 A | 5/2000 | Lindemann et al. |
| 6,071,009 A | 6/2000 | Clyne |
| 6,078,183 A | 6/2000 | Cole, Jr. |
| 6,078,500 A | 6/2000 | Beaman et al. |
| 6,090,261 A | 7/2000 | Mathieu |
| 6,091,236 A | 7/2000 | Piety et al. |
| 6,091,255 A | 7/2000 | Godfrey |
| 6,091,256 A | 7/2000 | Long et al. |
| 6,096,567 A | 8/2000 | Kaplan et al. |
| 6,100,815 A | 8/2000 | Pailthorp |
| 6,104,201 A | 8/2000 | Beaman et al. |
| 6,104,206 A | 8/2000 | Verkuil |
| 6,110,823 A | 8/2000 | Eldridge et al. |
| 6,114,864 A | 9/2000 | Soejima et al. |
| 6,114,865 A | 9/2000 | Lagowski et al. |
| 6,118,287 A | 9/2000 | Boil et al. |
| 6,118,894 A | 9/2000 | Schwartz et al. |
| 6,121,836 A | 9/2000 | Vallencourt |
| 6,124,725 A | 9/2000 | Sato |
| 6,127,831 A | 10/2000 | Khoury et al. |
| 6,130,536 A | 10/2000 | Powell et al. |
| 6,137,302 A | 10/2000 | Schwindt |
| 6,144,212 A | 11/2000 | Mizuta |
| 6,147,502 A | 11/2000 | Fryer et al. |
| 6,147,851 A | 11/2000 | Anderson |
| 6,150,186 A | 11/2000 | Chen et al. |
| 6,160,407 A | 12/2000 | Nikawa |
| 6,166,553 A | 12/2000 | Sinsheimer |
| 6,168,974 B1 | 1/2001 | Chang et al. |
| 6,169,410 B1 | 1/2001 | Grace et al. |
| 6,172,337 B1 | 1/2001 | Johnsgard et al. |
| 6,174,744 B1 | 1/2001 | Wantanabe et al. |
| 6,175,228 B1 | 1/2001 | Zamborelli et al. |
| 6,181,144 B1 | 1/2001 | Hembree et al. |
| 6,181,149 B1 | 1/2001 | Godfrey et al. |
| 6,181,297 B1 | 1/2001 | Leisten |
| 6,181,416 B1 | 1/2001 | Falk |
| 6,184,053 B1 | 2/2001 | Eldridge et al. |
| 6,184,587 B1 | 2/2001 | Khandros et al. |
| 6,184,845 B1 | 2/2001 | Leisten et al. |
| 6,191,596 B1 | 2/2001 | Abiko |
| 6,194,720 B1 | 2/2001 | Li et al. |
| 6,206,273 B1 | 3/2001 | Beaman et al. |
| 6,208,225 B1 | 3/2001 | Miller |
| RE37,130 E | 4/2001 | Fiori, Jr. |
| 6,211,663 B1 | 4/2001 | Moulthrop et al. |
| 6,211,837 B1 | 4/2001 | Crouch et al. |
| 6,215,196 B1 | 4/2001 | Eldridge et al. |
| 6,215,295 B1 | 4/2001 | Smith, III |
| 6,215,670 B1 | 4/2001 | Khandros |
| 6,218,910 B1 | 4/2001 | Miller |
| 6,222,031 B1 | 4/2001 | Wakabayashi et al. |
| 6,222,970 B1 | 4/2001 | Wach et al. |
| 6,229,327 B1 | 5/2001 | Boll et al. |
| 6,232,149 B1 | 5/2001 | Dozier, II et al. |
| 6,232,787 B1 | 5/2001 | Lo et al. |
| 6,232,788 B1 | 5/2001 | Schwindt et al. |
| 6,232,789 B1 | 5/2001 | Schwindt |
| 6,233,613 B1 | 5/2001 | Walker et al. |
| 6,236,223 B1 | 5/2001 | Brady et al. |
| 6,242,803 B1 | 6/2001 | Khandros et al. |
| 6,242,929 B1 | 6/2001 | Mizuta |
| 6,245,692 B1 | 6/2001 | Pearce et al. |
| 6,246,247 B1 | 6/2001 | Eldridge et al. |
| 6,251,595 B1 | 6/2001 | Gordon et al. |
| 6,255,126 B1 | 7/2001 | Mathieu et al. |
| 6,256,882 B1 | 7/2001 | Gleason et al. |
| 6,257,564 B1 | 7/2001 | Avneri et al. |
| 6,265,950 B1 | 7/2001 | Schmidt et al. |
| 6,268,015 B1 | 7/2001 | Mathieu et al. |
| 6,268,016 B1 | 7/2001 | Bhatt et al. |
| 6,271,673 B1 | 8/2001 | Furuta et al. |
| 6,274,823 B1 | 8/2001 | Khandros et al. |
| 6,275,043 B1 | 8/2001 | Mühlberger et al. |

| | | |
|---|---|---|
| 6,275,738 B1 | 8/2001 | Kasevich et al. |
| 6,278,051 B1 | 8/2001 | Peabody |
| 6,278,411 B1 | 8/2001 | Ohlsson et al. |
| 6,281,691 B1 | 8/2001 | Matsunaga et al. |
| 6,286,208 B1 | 9/2001 | Shih et al. |
| 6,292,760 B1 | 9/2001 | Burns |
| 6,295,729 B1 | 10/2001 | Beaman et al. |
| 6,300,775 B1 | 10/2001 | Peach et al. |
| 6,300,780 B1 | 10/2001 | Beaman et al. |
| 6,307,161 B1 | 10/2001 | Grube et al. |
| 6,307,363 B1 | 10/2001 | Anderson |
| 6,307,672 B1 | 10/2001 | DeNure |
| 6,310,483 B1 | 10/2001 | Taura et al. |
| 6,320,372 B1 | 11/2001 | Keller |
| 6,320,396 B1 | 11/2001 | Nikawa |
| 6,327,034 B1 | 12/2001 | Hoover et al. |
| 6,329,827 B1 | 12/2001 | Beaman et al. |
| 6,330,164 B1 | 12/2001 | Khandros et al. |
| 6,332,270 B2 | 12/2001 | Beaman et al. |
| 6,334,247 B1 | 1/2002 | Beaman et al. |
| 6,335,625 B1 | 1/2002 | Bryant et al. |
| 6,339,338 B1 | 1/2002 | Eldridge et al. |
| 6,340,568 B2 | 1/2002 | Hefti |
| 6,340,895 B1 | 1/2002 | Uher et al. |
| 6,351,885 B2 | 3/2002 | Suzuki et al. |
| 6,352,454 B1 | 3/2002 | Kim et al. |
| 6,359,456 B1 | 3/2002 | Hembree et al. |
| 6,362,792 B1 | 3/2002 | Sawamura et al. |
| 6,366,247 B1 | 4/2002 | Sawamura et al. |
| 6,369,776 B1 | 4/2002 | Leisten et al. |
| 6,376,258 B2 | 4/2002 | Hefti |
| 6,384,614 B1 | 5/2002 | Hager et al. |
| 6,384,615 B2 | 5/2002 | Schwindt |
| 6,388,455 B1 | 5/2002 | Kamieniecki et al. |
| 6,395,480 B1 | 5/2002 | Hefti |
| 6,396,296 B1 | 5/2002 | Tarter et al. |
| 6,396,298 B1 | 5/2002 | Young et al. |
| 6,400,168 B2 * | 6/2002 | Matsunaga et al. .......... 324/754 |
| 6,404,213 B2 | 6/2002 | Noda |
| 6,407,542 B1 | 6/2002 | Conte |
| 6,407,562 B1 | 6/2002 | Whiteman |
| 6,409,724 B1 | 6/2002 | Penny et al. |
| 6,414,478 B1 | 7/2002 | Suzuki |
| 6,415,858 B1 | 7/2002 | Getchel et al. |
| 6,418,009 B1 | 7/2002 | Brunette |
| 6,420,722 B2 | 7/2002 | Moore et al. |
| 6,424,316 B1 | 7/2002 | Leisten et al. |
| 6,429,029 B1 | 8/2002 | Eldridge et al. |
| 6,441,315 B1 | 8/2002 | Eldridge et al. |
| 6,442,831 B1 | 9/2002 | Khandros et al. |
| 6,447,339 B1 | 9/2002 | Reed et al. |
| 6,448,788 B1 | 9/2002 | Meaney et al. |
| 6,448,865 B1 | 9/2002 | Miller |
| 6,452,406 B1 | 9/2002 | Beaman et al. |
| 6,452,411 B1 | 9/2002 | Miller et al. |
| 6,456,099 B1 | 9/2002 | Eldridge et al. |
| 6,456,103 B1 | 9/2002 | Eldridge et al. |
| 6,459,343 B1 | 10/2002 | Miller |
| 6,459,739 B1 | 10/2002 | Vitenberg |
| 6,468,098 B1 | 10/2002 | Eldridge |
| 6,475,822 B2 | 11/2002 | Eldridge |
| 6,476,333 B1 | 11/2002 | Khandros et al. |
| 6,476,442 B1 | 11/2002 | Williams et al. |
| 6,476,630 B1 | 11/2002 | Whitten et al. |
| 6,479,308 B1 | 11/2002 | Eldridge |
| 6,480,013 B1 | 11/2002 | Nayler et al. |
| 6,480,978 B1 | 11/2002 | Roy et al. |
| 6,481,939 B1 | 11/2002 | Gillespie et al. |
| 6,482,013 B2 | 11/2002 | Eldridge et al. |
| 6,483,327 B1 | 11/2002 | Bruce et al. |
| 6,488,405 B1 | 12/2002 | Eppes et al. |
| 6,490,471 B2 | 12/2002 | Svenson et al. |
| 6,491,968 B1 | 12/2002 | Mathieu et al. |
| 6,496,024 B2 | 12/2002 | Schwindt |
| 6,499,121 B1 | 12/2002 | Roy et al. |
| 6,501,343 B2 | 12/2002 | Miller |
| 6,509,751 B1 | 1/2003 | Mathieu et al. |
| 6,512,482 B1 | 1/2003 | Nelson et al. |
| 6,520,778 B1 | 2/2003 | Eldridge et al. |
| 6,525,555 B1 | 2/2003 | Khandros et al. |
| 6,526,655 B2 | 3/2003 | Beaman et al. |
| 6,528,984 B2 | 3/2003 | Beaman et al. |
| 6,528,993 B1 | 3/2003 | Shin et al. |
| 6,529,844 B1 | 3/2003 | Kapetanic et al. |
| 6,534,856 B1 | 3/2003 | Dozier, II et al. |
| 6,538,214 B2 | 3/2003 | Khandros |
| 6,538,538 B2 | 3/2003 | Hreish et al. |
| 6,539,531 B2 | 3/2003 | Miller et al. |
| 6,548,311 B1 | 4/2003 | Knoll |
| 6,549,022 B1 | 4/2003 | Cole, Jr. et al. |
| 6,549,106 B2 | 4/2003 | Martin |
| 6,551,844 B1 | 4/2003 | Eldridge et al. |
| 6,551,884 B2 | 4/2003 | Masuoka |
| 6,559,671 B2 | 5/2003 | Miller et al. |
| 6,566,079 B2 | 5/2003 | Hefti |
| 6,572,608 B1 | 6/2003 | Lee et al. |
| 6,573,702 B2 | 6/2003 | Marcuse et al. |
| 6,578,264 B1 | 6/2003 | Gleason et al. |
| 6,580,283 B1 | 6/2003 | Carbone et al. |
| 6,582,979 B2 | 6/2003 | Coccioli et al. |
| 6,587,327 B1 | 7/2003 | Devoe et al. |
| 6,597,187 B2 | 7/2003 | Eldridge et al. |
| 6,603,322 B1 | 8/2003 | Boll et al. |
| 6,603,323 B1 | 8/2003 | Miller et al. |
| 6,603,324 B2 | 8/2003 | Eldridge et al. |
| 6,605,941 B2 | 8/2003 | Abe |
| 6,605,951 B1 | 8/2003 | Cowan |
| 6,605,955 B1 | 8/2003 | Costello et al. |
| 6,606,014 B2 | 8/2003 | Miller |
| 6,606,575 B2 | 8/2003 | Miller |
| 6,608,494 B1 | 8/2003 | Bruce et al. |
| 6,611,417 B2 | 8/2003 | Chen |
| 6,615,485 B2 | 9/2003 | Eldridge et al. |
| 6,616,966 B2 | 9/2003 | Mathieu et al. |
| 6,617,862 B1 | 9/2003 | Bruce |
| 6,617,866 B1 | 9/2003 | Ickes |
| 6,621,082 B2 | 9/2003 | Morita et al. |
| 6,621,260 B2 | 9/2003 | Eldridge et al. |
| 6,622,103 B1 | 9/2003 | Miller |
| 6,624,648 B2 | 9/2003 | Eldridge et al. |
| 6,627,461 B2 | 9/2003 | Chapman et al. |
| 6,627,483 B2 | 9/2003 | Ondricek et al. |
| 6,627,980 B2 | 9/2003 | Eldridge |
| 6,628,503 B2 | 9/2003 | Sogard |
| 6,628,980 B2 | 9/2003 | Atalar et al. |
| 6,633,174 B1 | 10/2003 | Satya et al. |
| 6,636,182 B2 | 10/2003 | Mehltretter |
| 6,639,461 B1 | 10/2003 | Tam et al. |
| 6,640,415 B2 | 11/2003 | Eslamy et al. |
| 6,640,432 B1 | 11/2003 | Mathieu et al. |
| 6,642,625 B2 | 11/2003 | Dozier, II et al. |
| 6,643,597 B1 | 11/2003 | Dunsmore |
| 6,644,982 B1 | 11/2003 | Ondricek et al. |
| 6,646,520 B2 | 11/2003 | Miller |
| 6,653,903 B2 | 11/2003 | Leich et al. |
| 6,655,023 B1 | 12/2003 | Eldridge et al. |
| 6,657,455 B2 | 12/2003 | Eldridge et al. |
| 6,657,601 B2 | 12/2003 | McLean |
| 6,661,316 B2 | 12/2003 | Hreish et al. |
| 6,664,628 B2 | 12/2003 | Khandros et al. |
| 6,669,489 B1 | 12/2003 | Dozier, II et al. |
| 6,672,875 B1 | 1/2004 | Mathieu et al. |
| 6,677,744 B1 | 1/2004 | Long |
| 6,678,850 B2 | 1/2004 | Roy et al. |
| 6,678,876 B2 | 1/2004 | Stevens et al. |
| 6,680,659 B2 | 1/2004 | Miller |

| | | |
|---|---|---|
| 6,685,817 B1 | 2/2004 | Mathieu |
| 6,686,754 B2 | 2/2004 | Miller |
| 6,690,185 B1 | 2/2004 | Khandros et al. |
| 6,701,265 B2 | 3/2004 | Hill et al. |
| 6,701,612 B2 | 3/2004 | Khandros et al. |
| 6,707,548 B2 | 3/2004 | Kreimer et al. |
| 6,708,403 B2 | 3/2004 | Beaman et al. |
| 6,710,798 B1 | 3/2004 | Hershel et al. |
| 6,713,374 B2 | 3/2004 | Eldridge et al. |
| 6,714,828 B2 | 3/2004 | Eldridge et al. |
| 6,717,426 B2 | 4/2004 | Iwasaki |
| 6,720,501 B1 | 4/2004 | Henson |
| 6,722,032 B2 | 4/2004 | Beaman et al. |
| 6,724,205 B1 | 4/2004 | Hayden et al. |
| 6,724,928 B1 | 4/2004 | Davis |
| 6,727,579 B1 | 4/2004 | Eldridge et al. |
| 6,727,580 B1 | 4/2004 | Eldridge et al. |
| 6,727,716 B1 | 4/2004 | Sharif |
| 6,729,019 B2 | 5/2004 | Grube et al. |
| 6,731,804 B1 | 5/2004 | Carrieri et al. |
| 6,734,687 B1 | 5/2004 | Ishitani et al. |
| 6,737,920 B2 | 5/2004 | Jen et al. |
| 6,741,085 B1 | 5/2004 | Khandros et al. |
| 6,741,092 B2 | 5/2004 | Eldridge et al. |
| 6,741,129 B1 | 5/2004 | Corsi et al. |
| 6,744,268 B2 | 6/2004 | Hollman |
| 6,753,679 B1 | 6/2004 | Kwong et al. |
| 6,753,699 B2 | 6/2004 | Stockstad |
| 6,759,311 B2 | 7/2004 | Eldridge et al. |
| 6,759,859 B2 | 7/2004 | Deng et al. |
| 6,764,869 B2 | 7/2004 | Eldridge |
| 6,768,328 B2 | 7/2004 | Self et al. |
| 6,770,955 B1 | 8/2004 | Coccioli et al. |
| 6,771,806 B1 | 8/2004 | Satya et al. |
| 6,777,319 B2 | 8/2004 | Grube et al. |
| 6,778,140 B1 | 8/2004 | Yeh |
| 6,778,406 B2 | 8/2004 | Eldridge et al. |
| 6,780,001 B2 | 8/2004 | Eldridge et al. |
| 6,784,674 B2 | 8/2004 | Miller |
| 6,784,677 B2 | 8/2004 | Miller et al. |
| 6,784,679 B2 | 8/2004 | Sweet et al. |
| 6,788,093 B2 | 9/2004 | Aitren et al. |
| 6,788,094 B2 | 9/2004 | Khandros et al. |
| 6,791,176 B2 | 9/2004 | Mathieu et al. |
| 6,794,888 B2 | 9/2004 | Kawaguchi et al. |
| 6,794,934 B2 | 9/2004 | Betti-Berutto et al. |
| 6,794,950 B2 | 9/2004 | Du Toit et al. |
| 6,798,225 B2 | 9/2004 | Miller |
| 6,798,226 B2 | 9/2004 | Altmann et al. |
| 6,806,724 B2 | 10/2004 | Hayden et al. |
| 6,806,836 B2 | 10/2004 | Ogawa et al. |
| 6,807,734 B2 | 10/2004 | Eldridge et al. |
| 6,809,533 B1 | 10/2004 | Anlage et al. |
| 6,811,406 B2 | 11/2004 | Grube |
| 6,812,691 B2 | 11/2004 | Miller |
| 6,812,718 B1 | 11/2004 | Chong et al. |
| 6,815,963 B2 | 11/2004 | Gleason et al. |
| 6,816,031 B1 | 11/2004 | Miller |
| 6,816,840 B1 | 11/2004 | Goodwin, III |
| 6,817,052 B2 | 11/2004 | Grube |
| 6,818,840 B2 | 11/2004 | Khandros |
| 6,822,463 B1 | 11/2004 | Jacobs |
| 6,822,529 B2 | 11/2004 | Miller |
| 6,825,052 B2 | 11/2004 | Eldridge et al. |
| 6,825,422 B2 | 11/2004 | Eldridge et al. |
| 6,827,584 B2 | 12/2004 | Mathieu et al. |
| 6,835,898 B2 | 12/2004 | Eldridge et al. |
| 6,836,962 B2 | 1/2005 | Khandros et al. |
| 6,838,885 B2 | 1/2005 | Kamitani |
| 6,838,893 B2 | 1/2005 | Khandros et al. |
| 6,839,964 B2 | 1/2005 | Henson |
| 6,845,491 B2 | 1/2005 | Miller et al. |
| 6,850,082 B2 | 2/2005 | Schwindt |
| 6,856,129 B2 | 2/2005 | Thomas et al. |
| 6,856,150 B2 | 2/2005 | Sporck et al. |
| 6,862,727 B2 | 3/2005 | Stevens |
| 6,864,105 B2 | 3/2005 | Grube et al. |
| 6,864,694 B2 | 3/2005 | McTigue |
| 6,870,381 B2 | 3/2005 | Grube |
| 6,882,239 B2 | 4/2005 | Miller |
| 6,882,546 B2 | 4/2005 | Miller |
| 6,887,723 B1 | 5/2005 | Ondricek et al. |
| 6,888,362 B2 | 5/2005 | Eldridge et al. |
| 6,891,385 B2 | 5/2005 | Miller |
| 6,900,646 B2 | 5/2005 | Kasukabe et al. |
| 6,900,647 B2 | 5/2005 | Yoshida et al. |
| 6,900,652 B2 | 5/2005 | Mazur |
| 6,900,653 B2 | 5/2005 | Yu et al. |
| 6,902,416 B2 | 6/2005 | Feldman |
| 6,902,941 B2 | 6/2005 | Sun |
| 6,903,563 B2 | 6/2005 | Yoshida et al. |
| 6,906,506 B1 | 6/2005 | Reano et al. |
| 6,906,539 B2 | 6/2005 | Wilson et al. |
| 6,906,542 B2 | 6/2005 | Sakagawa et al. |
| 6,906,543 B2 | 6/2005 | Lou et al. |
| 6,907,149 B2 | 6/2005 | Slater |
| 6,908,364 B2 | 6/2005 | Back et al. |
| 6,909,297 B2 | 6/2005 | Ji et al. |
| 6,909,300 B2 | 6/2005 | Lu et al. |
| 6,909,983 B2 | 6/2005 | Sutherland |
| 6,910,268 B2 | 6/2005 | Miller |
| 6,911,814 B2 | 6/2005 | Miller et al. |
| 6,911,826 B2 | 6/2005 | Plotnikov et al. |
| 6,911,834 B2 | 6/2005 | Mitchell et al. |
| 6,911,835 B2 | 6/2005 | Chraft et al. |
| 6,912,468 B2 | 6/2005 | Marin et al. |
| 6,913,468 B2 | 7/2005 | Dozier, II et al. |
| 6,914,244 B2 | 7/2005 | Alani |
| 6,914,427 B2 | 7/2005 | Gifford et al. |
| 6,914,430 B2 | 7/2005 | Hasegawa et al. |
| 6,914,580 B2 | 7/2005 | Leisten |
| 6,917,195 B2 | 7/2005 | Hollman |
| 6,917,210 B2 | 7/2005 | Miller |
| 6,917,211 B2 | 7/2005 | Yoshida et al. |
| 6,917,525 B2 | 7/2005 | Mok et al. |
| 6,919,732 B2 | 7/2005 | Yoshida et al. |
| 6,922,069 B2 | 7/2005 | Jun |
| 6,924,653 B2 | 8/2005 | Schaeffer et al. |
| 6,924,655 B2 | 8/2005 | Kirby |
| 6,927,078 B2 | 8/2005 | Saijo et al. |
| 6,927,079 B1 | 8/2005 | Fyfield |
| 6,927,586 B2 | 8/2005 | Thiessen |
| 6,927,587 B2 | 8/2005 | Yoshioka |
| 6,927,598 B2 | 8/2005 | Lee et al. |
| 6,930,498 B2 | 8/2005 | Tervo et al. |
| 6,933,713 B2 | 8/2005 | Cannon |
| 6,933,717 B1 | 8/2005 | Dogaru et al. |
| 6,933,725 B2 | 8/2005 | Lim et al. |
| 6,933,736 B2 | 8/2005 | Kobayashi et al. |
| 6,933,737 B2 | 8/2005 | Sugawara |
| 6,937,020 B2 | 8/2005 | Munson et al. |
| 6,937,037 B2 | 8/2005 | Eldridge et al. |
| 6,937,040 B2 | 8/2005 | Maeda et al. |
| 6,937,042 B2 | 8/2005 | Yoshida et al. |
| 6,937,045 B2 | 8/2005 | Sinclair |
| 6,937,341 B1 | 8/2005 | Woollam et al. |
| 6,940,264 B2 | 9/2005 | Ryken, Jr. et al. |
| 6,940,283 B2 | 9/2005 | McQueeney |
| 6,943,563 B2 | 9/2005 | Martens |
| 6,943,571 B2 | 9/2005 | Worledge |
| 6,943,574 B2 | 9/2005 | Altmann et al. |
| 6,944,380 B1 | 9/2005 | Hideo et al. |
| 6,946,859 B2 | 9/2005 | Karavakis et al. |
| 6,946,860 B2 | 9/2005 | Cheng et al. |
| 6,948,391 B2 | 9/2005 | Brassell et al. |
| 6,948,981 B2 | 9/2005 | Pade |

| | | | | | | |
|---|---|---|---|---|---|---|
| 6,949,942 B2 | 9/2005 | Eldridge et al. | | 2002/0011863 A1 | 1/2002 | Takahashi et al. |
| 6,970,001 B2 | 11/2005 | Chheda et al. | | 2002/0050828 A1 | 5/2002 | Seward, IV et al. |
| 6,987,483 B2 | 1/2006 | Tran | | 2002/0070743 A1 | 6/2002 | Felici et al. |
| 7,001,785 B1 | 2/2006 | Chen | | 2002/0070745 A1 | 6/2002 | Johnson et al. |
| 7,002,133 B2 | 2/2006 | Beausoleil et al. | | 2002/0079911 A1 | 6/2002 | Schwindt |
| 7,002,363 B2 | 2/2006 | Mathieu | | 2002/0109088 A1 | 8/2002 | Nara et al. |
| 7,002,364 B2 | 2/2006 | Kang et al. | | 2002/0118034 A1 | 8/2002 | Laureanti |
| 7,003,184 B2 | 2/2006 | Ronnekleiv et al. | | 2002/0149377 A1 | 10/2002 | Hefti et al. |
| 7,005,842 B2 | 2/2006 | Fink et al. | | 2002/0153909 A1 | 10/2002 | Petersen et al. |
| 7,005,868 B2 | 2/2006 | McTigue | | 2002/0163769 A1 | 11/2002 | Brown |
| 7,005,879 B1 | 2/2006 | Robertazzi | | 2002/0168659 A1 | 11/2002 | Hefti et al. |
| 7,006,046 B2 | 2/2006 | Aisenbrey | | 2002/0176160 A1 | 11/2002 | Suzuki et al. |
| 7,007,380 B2 | 3/2006 | Das et al. | | 2002/0180466 A1 | 12/2002 | Hiramatsu et al. |
| 7,009,188 B2 | 3/2006 | Wang | | 2002/0197709 A1 | 12/2002 | Van der Weide et al. |
| 7,009,383 B2 | 3/2006 | Harwood et al. | | 2003/0010877 A1 | 1/2003 | Landreville et al. |
| 7,009,415 B2 | 3/2006 | Kobayashi et al. | | 2003/0030822 A1 | 2/2003 | Finarov |
| 7,011,531 B2 | 3/2006 | Egitto et al. | | 2003/0032000 A1 | 2/2003 | Liu et al. |
| 7,012,425 B2 | 3/2006 | Shoji | | 2003/0040004 A1 | 2/2003 | Hefti et al. |
| 7,012,441 B2 | 3/2006 | Chou et al. | | 2003/0057513 A1 | 3/2003 | Leedy |
| 7,013,221 B1 | 3/2006 | Friend et al. | | 2003/0062915 A1 | 4/2003 | Arnold et al. |
| 7,014,499 B2 | 3/2006 | Yoon | | 2003/0072549 A1 | 4/2003 | Facer et al. |
| 7,015,455 B2 | 3/2006 | Mitsuoka et al. | | 2003/0076585 A1 | 4/2003 | Ledley |
| 7,015,689 B2 | 3/2006 | Kasajima et al. | | 2003/0077649 A1 | 4/2003 | Cho et al. |
| 7,015,690 B2 | 3/2006 | Wang et al. | | 2003/0088180 A1 | 5/2003 | Van Veen et al. |
| 7,015,703 B2 | 3/2006 | Hopkins et al. | | 2003/0119057 A1 | 6/2003 | Gascoyne et al. |
| 7,015,707 B2 | 3/2006 | Cherian | | 2003/0139662 A1 | 7/2003 | Seidman |
| 7,015,708 B2 | 3/2006 | Beckous et al. | | 2003/0139790 A1 | 7/2003 | Ingle et al. |
| 7,015,709 B2 | 3/2006 | Capps et al. | | 2003/0155939 A1 | 8/2003 | Lutz et al. |
| 7,015,710 B2 | 3/2006 | Yoshida et al. | | 2003/0170898 A1 | 9/2003 | Gunderson et al. |
| 7,015,711 B2 | 3/2006 | Rothaug et al. | | 2003/0184332 A1 | 10/2003 | Tomimatsu et al. |
| 7,019,541 B2 | 3/2006 | Kittrell | | 2003/0215966 A1 | 11/2003 | Rolda et al. |
| 7,019,544 B1 | 3/2006 | Jacobs et al. | | 2004/0015060 A1 | 1/2004 | Samsoondar et al. |
| 7,019,701 B2 | 3/2006 | Ohno et al. | | 2004/0021475 A1 | 2/2004 | Ito et al. |
| 7,020,360 B2 | 3/2006 | Satomura et al. | | 2004/0061514 A1 | 4/2004 | Schwindt et al. |
| 7,020,363 B2 | 3/2006 | Johannessen | | 2004/0066181 A1 | 4/2004 | Theis |
| 7,022,976 B1 | 4/2006 | Santana, Jr. et al. | | 2004/0069776 A1 | 4/2004 | Fagrell et al. |
| 7,022,985 B2 | 4/2006 | Knebel et al. | | 2004/0090223 A1 | 5/2004 | Yonezawa |
| 7,023,225 B2 | 4/2006 | Blackwood | | 2004/0095145 A1 | 5/2004 | Boudiaf et al. |
| 7,023,226 B2 | 4/2006 | Okumura et al. | | 2004/0095641 A1 | 5/2004 | Russum et al. |
| 7,023,231 B2 | 4/2006 | Howland, Jr. et al. | | 2004/0100276 A1 | 5/2004 | Fanton |
| 7,025,628 B2 | 4/2006 | LaMeres et al. | | 2004/0100297 A1 | 5/2004 | Tanioka et al. |
| 7,026,832 B2 | 4/2006 | Chaya et al. | | 2004/0108847 A1 | 6/2004 | Stoll et al. |
| 7,026,833 B2 | 4/2006 | Rincon et al. | | 2004/0113640 A1 | 6/2004 | Cooper et al. |
| 7,026,834 B2 | 4/2006 | Hwang | | 2004/0130787 A1 | 7/2004 | Thome-Forster et al. |
| 7,026,835 B2 | 4/2006 | Farnworth et al. | | 2004/0132222 A1 | 7/2004 | Hembree et al. |
| 7,030,599 B2 | 4/2006 | Douglas | | 2004/0134899 A1 | 7/2004 | Hiramatsu et al. |
| 7,030,827 B2 | 4/2006 | Mahler et al. | | 2004/0140819 A1 | 7/2004 | McTigue et al. |
| 7,032,307 B2 | 4/2006 | Matsunaga et al. | | 2004/0147034 A1 | 7/2004 | Gore et al. |
| 7,034,553 B2 | 4/2006 | Gilboe | | 2004/0162689 A1 | 8/2004 | Jamneala et al. |
| 7,035,738 B2 | 4/2006 | Matsumoto et al. | | 2004/0170312 A1 | 9/2004 | Soenksen |
| 7,071,722 B2 * | 7/2006 | Yamada et al. ............... 324/765 | | 2004/0175294 A1 | 9/2004 | Ellison et al. |
| 7,088,981 B2 | 8/2006 | Chang | | 2004/0186382 A1 | 9/2004 | Modell et al. |
| 7,096,133 B1 | 8/2006 | Martin et al. | | 2004/0193382 A1 | 9/2004 | Adamian et al. |
| 7,161,363 B2 | 1/2007 | Gleason et al. | | 2004/0197771 A1 | 10/2004 | Powers et al. |
| 7,187,188 B2 | 3/2007 | Andrews et al. | | 2004/0199350 A1 | 10/2004 | Blackham et al. |
| 7,188,037 B2 | 3/2007 | Hidehira | | 2004/0201388 A1 | 10/2004 | Barr |
| 7,271,603 B2 | 9/2007 | Gleason et al. | | 2004/0207072 A1 | 10/2004 | Hiramatsu et al. |
| 2001/0002794 A1 | 6/2001 | Draving et al. | | 2004/0207424 A1 | 10/2004 | Hollman |
| 2001/0009061 A1 | 7/2001 | Gleason et al. | | 2004/0239338 A1 | 12/2004 | Johnsson et al. |
| 2001/0009377 A1 | 7/2001 | Schwindt et al. | | 2004/0246004 A1 | 12/2004 | Heuermann |
| 2001/0010468 A1 | 8/2001 | Gleason et al. | | 2004/0251922 A1 | 12/2004 | Martens et al. |
| 2001/0020283 A1 | 9/2001 | Sakaguchi | | 2005/0024069 A1 | 2/2005 | Hayden et al. |
| 2001/0024116 A1 | 9/2001 | Draving | | 2005/0026276 A1 | 2/2005 | Chou |
| 2001/0030549 A1 | 10/2001 | Gleason et al. | | 2005/0030047 A1 | 2/2005 | Adamian |
| 2001/0043073 A1 | 11/2001 | Montoya | | 2005/0054029 A1 | 3/2005 | Tomimatsu et al. |
| 2001/0044152 A1 | 11/2001 | Burnett | | 2005/0062533 A1 | 3/2005 | Vice |
| 2001/0045511 A1 | 11/2001 | Moore et al. | | 2005/0068054 A1 | 3/2005 | Mok et al. |
| 2001/0054906 A1 | 12/2001 | Fujimura | | 2005/0083130 A1 | 4/2005 | Grilo |
| 2002/0005728 A1 | 1/2002 | Babson et al. | | 2005/0088191 A1 | 4/2005 | Lesher |
| 2002/0008533 A1 | 1/2002 | Ito et al. | | 2005/0101846 A1 | 5/2005 | Fine et al. |
| 2002/0009377 A1 | 1/2002 | Shafer | | 2005/0116730 A1 | 6/2005 | Hsu |
| 2002/0009378 A1 | 1/2002 | Obara | | 2005/0142033 A1 | 6/2005 | Glezer et al. |
| 2002/0011859 A1 | 1/2002 | Smith et al. | | 2005/0151548 A1 | 7/2005 | Hayden et al. |

| | | | | | | |
|---|---|---|---|---|---|---|
| 2005/0156675 | A1 | 7/2005 | Rohde et al. | JP | 62-51235 | 3/1987 |
| 2005/0164160 | A1 | 7/2005 | Gunter et al. | JP | 62-098634 | 5/1987 |
| 2005/0165316 | A1 | 7/2005 | Lowery et al. | JP | 62-107937 | 5/1987 |
| 2005/0168722 | A1 | 8/2005 | Forstner et al. | JP | 62098634 | 5/1987 |
| 2005/0174191 | A1 | 8/2005 | Brunker et al. | JP | 62107937 | 5/1987 |
| 2005/0178980 | A1 | 8/2005 | Skidmore et al. | JP | 62-179126 | 8/1987 |
| 2005/0195124 | A1 | 9/2005 | Puente Baliarda et al. | JP | 62-239050 | 10/1987 |
| 2005/0229053 | A1 | 10/2005 | Sunter | JP | 62239050 | 10/1987 |
| 2005/0236587 | A1 | 10/2005 | Kodama et al. | JP | 62295374 | 12/1987 |
| 2005/0237102 | A1 | 10/2005 | Tanaka | JP | 63-108736 | 5/1988 |
| 2006/0030060 | A1 | 2/2006 | Noguchi et al. | JP | 63-129640 | 6/1988 |
| 2006/0052075 | A1 | 3/2006 | Galivanche et al. | JP | 63-143814 | 6/1988 |
| 2006/0155270 | A1 | 7/2006 | Hancock et al. | JP | 63-152141 | 6/1988 |
| 2006/0184041 | A1 | 8/2006 | Andrews et al. | JP | 63-192246 | 8/1988 |
| 2006/0226864 | A1 | 10/2006 | Kramer | JP | 63-318745 | 12/1988 |
| 2007/0024506 | A1 | 2/2007 | Hardacker | JP | 64-21309 | 2/1989 |
| 2007/0030021 | A1 | 2/2007 | Cowan et al. | JP | 1-165968 | 6/1989 |

FOREIGN PATENT DOCUMENTS

| | | | | | |
|---|---|---|---|---|---|
| CN | 1083975 | 3/1994 | JP | 1-214038 | 8/1989 |
| DE | 2951072 | 7/1981 | JP | 01209380 | 8/1989 |
| DE | 3426565 | 1/1986 | JP | 1-219575 | 9/1989 |
| DE | 3637549 | 5/1988 | JP | 1-296167 | 11/1989 |
| DE | 288234 | 3/1991 | JP | 2-22836 | 1/1990 |
| DE | 4223658 | 1/1993 | JP | 2-124469 | 5/1990 |
| DE | 9313420 | 10/1993 | JP | 2-141681 | 5/1990 |
| DE | 19522774 | 1/1997 | JP | 02124469 | 5/1990 |
| DE | 19542955 | 5/1997 | JP | 02135804 | 5/1990 |
| DE | 19618717 | 1/1998 | JP | 2-191352 | 7/1990 |
| DE | 19749687 | 5/1998 | JP | 3-175367 | 7/1991 |
| DE | 29809568 | 10/1998 | JP | 3-196206 | 8/1991 |
| DE | 10000324 | 7/2001 | JP | 3196206 | 8/1991 |
| DE | 20220754 | 5/2004 | JP | 3-228348 | 10/1991 |
| EP | 230348 | 7/1985 | JP | 03228348 | 10/1991 |
| EP | 0230766 | 12/1985 | JP | 4-130639 | 5/1992 |
| EP | 0195520 | 9/1986 | JP | 04130639 | 5/1992 |
| EP | 0230348 | 7/1987 | JP | 4-159043 | 6/1992 |
| EP | 0259163 | 3/1988 | JP | 04159043 | 6/1992 |
| EP | 0259183 | 3/1988 | JP | 4-206930 | 7/1992 |
| EP | 0259942 | 3/1988 | JP | 04206930 | 7/1992 |
| EP | 0261986 | 3/1988 | JP | 4-340248 | 11/1992 |
| EP | 0270422 | 6/1988 | JP | 5-082631 | 4/1993 |
| EP | 0333521 | 9/1989 | JP | 05082631 | 4/1993 |
| EP | 0460911 | 12/1991 | JP | 5-113451 | 5/1993 |
| EP | 0846476 | 6/1998 | JP | 51-57790 | 6/1993 |
| EP | 0 945 736 | 9/1999 | JP | 5157790 | 6/1993 |
| EP | 0945736 | 9/1999 | JP | 51-66893 | 7/1993 |
| EP | 945736 A3 | 9/1999 | JP | 5166893 | 7/1993 |
| GB | 579665 | 8/1946 | JP | 6-85044 | 3/1994 |
| GB | 2014315 | 8/1979 | JP | 60-71425 | 3/1994 |
| GB | 2179458 | 3/1987 | JP | 6-102313 | 4/1994 |
| JP | 52-19046 | 2/1977 | JP | 6-132709 | 5/1994 |
| JP | 53-037077 | 4/1978 | JP | 6154238 | 6/1994 |
| JP | 53037077 | 4/1978 | JP | 6-295949 | 10/1994 |
| JP | 53-052354 | 5/1978 | JP | 7-005078 | 1/1995 |
| JP | 55-115383 | 9/1980 | JP | 7-12871 | 1/1995 |
| JP | 55115383 | 9/1980 | JP | 7005078 | 1/1995 |
| JP | 56-007439 | 1/1981 | JP | 7012871 | 1/1995 |
| JP | 56-88333 | 7/1981 | JP | 8-35987 | 2/1996 |
| JP | 5691503 | 7/1981 | JP | 8035987 | 2/1996 |
| JP | 56088333 | 7/1981 | JP | 8-261898 | 10/1996 |
| JP | 57-075480 | 5/1982 | JP | 8-330401 | 12/1996 |
| JP | 57075480 | 5/1982 | JP | 08330401 | 12/1996 |
| JP | 57-163035 | 10/1982 | JP | 09127432 | 5/1997 |
| JP | 57163035 | 10/1982 | JP | 10-48256 | 2/1998 |
| JP | 57171805 | 10/1982 | JP | 10-116866 | 5/1998 |
| JP | 58-130602 | 8/1983 | JP | 10116866 | 5/1998 |
| JP | 594189 U | 1/1984 | JP | 11-023975 | 1/1999 |
| JP | 60-5462 | 4/1984 | JP | 11004001 | 1/1999 |
| JP | 60-236241 | 11/1985 | JP | 11023975 | 1/1999 |
| JP | 61142802 | 6/1986 | JP | 2000-329664 | 11/2000 |
| JP | 62-11243 | 1/1987 | JP | 2001-124676 | 5/2001 |
| | | | JP | 2001-189285 | 7/2001 |
| | | | JP | 2001-189378 | 7/2001 |
| | | | JP | 2002-203879 | 7/2002 |

| | | |
|---|---|---|
| JP | 2002-243502 | 8/2002 |
| JP | 2002243502 | 8/2002 |
| KR | 2003/0090158 | 11/2003 |
| SU | 843040 | 6/1981 |
| SU | 1195402 | 11/1985 |
| SU | 1327023 | 7/1987 |
| SU | 1392603 | 4/1988 |
| WO | WO80/00101 | 1/1980 |
| WO | WO94/10554 | 5/1994 |
| WO | WO98/07040 | 2/1998 |
| WO | WO 00/73905 | 12/2000 |
| WO | WO01/07207 | 2/2001 |
| WO | WO 01/69656 | 9/2001 |
| WO | WO 2004/044604 | 5/2004 |
| WO | WO 2004/065944 | 8/2004 |
| WO | WO 2004/079299 | 9/2004 |
| WO | WO 2005/062025 | 7/2005 |
| WO | WO 2007/145727 | 12/2007 |
| WO | WO 2007/145728 | 12/2007 |

OTHER PUBLICATIONS

Cohn, S. "Properties of Ridge Wave Guide," Proceedings of the I.R.E., Aug. 1947, pp. 783-788.
Cohn, Seymour B., "Optimum Design of Stepped Transmission-Line Transformers," I.R.E. Transactions—Microwave Theory and Techniques, No. 3, 1955, pp. 16-21.
Hopper, Samuel, "The Design of Ridged Waveguides," I.R.E. Transactions—Microwave Theory and techniques, No. 5, Oct. 1955, pp. 20-29.
Chen, Tsung-Shan, "Calculation of Parameters of Ridge Waveguides," IRE Transactions on Microwave Theory and Techniques, Jan. 1957, pp. 12-17.
IRE 20.1, Committee Personnel, "IRE Standards on Methods of Measuring Noise in Linear Twoports, 1959," Proc. IRE, vol. 48, pp. 60-68, Jan. 1960, pp. 32-40.
Fukui, H., "Available Power Gain, Noise Figure, and Noise Measure of Two-Ports and Their Graphical Representations," pp. 18-23, Reprinted from IEEE Trans. Circuit Theory, vol. CT-13, pp. 137-142, Jun. 1966.
Beaubien, M.J., et al., "An Accurate Finite-Difference Method for Higher Order Waveguide Modes," IEEE Transactions on Microwave Theory and Techniques, vol. M11-16, No. 12, Dec. 1968, pp. 1007-1017.
Lane, Richard Q., "The Determination of Device Noise Parameters," Proc. IEEE, vol. 57, Aug. 1969, pp. 1461-1462.
Adamian, Vaheh, et al., "A Novel Procedure for Receiver Noise Characterization," IEEE Transactions on Instrumentaton and Measurement, Jun. 1973.
Daly, P., "Polar Geometry Waveguides by finite-element Methods," IEEE Transactions on Microwave Theory and Technique, vol. MTT-22, No. 3, Mar. 1974, pp. 202-209.
Fink, Donald G., et al., "Electronics Engineers' Handbook," Sec. 17-52 Measurement and Control Circuits, 1975, pp. 17-22-17-27.
Bry, A., et al, "Bypass Capacitor for Chip Probe," IBM Technical Disclosure Bulletin, vol. 18, No. 11, Apr. 1976.
Skobern, J.R., "Subminiature High-Frequency Probe," IBM Technical disclosure Bulletin, vol. 19, No. 10, Mar. 1977.
Berg, William, et al., "Elastomers solve tough problems in high-frequency systems," 2119 EDN vol. 23, Jan. 5, 1978, pp. 36-42.
Eisenhart, R.L., "A Better Microstrip Connector," 1978 IEEE MTT-S International Microwave Symposium Digest, Jun. 27-29, Ottawa, Canada.
Gommlich, Hans, et al., "Verzerrungsmessungen-Wichtige Aufgabe in der Ubertagungstechnik," Elektronik 8/Apr. 23, 1982, pp. 110-119.
Larock, V., et al., "Automatic Noise Temperature Measurement Through Frequency Variation," IEEE Transactions on Microwave Theory and Techniques, vol. MTT-30, No. 8, Aug. 1982, pp. 1286-1288.
Maury Microwave Corp., "Transistor Test Fixture (TTF) Inserts, Calibration & Check Devices, MT951, MT952, MT953 Series," Advanced Data 4T-002, Sep. 20, 1982, pp. 1-2.

Maury Microwave Corp., "Transistor Test Fixture (TTF)," MT950 Series, Advanced data 4T-001, Oct. 7, 1982.
Abbott, D.A., et al., "Automatic noise figure measurements with computer control and correction," 8054 Radio and Electronic Engineer vol. 52, Oct. 1982, pp. 468-474.
Swain, Howard L. et al., "Noise Figure Meter Sets Records for Accuracy, Repeatability, and Convenience," 1266 Hewlett-Packard Journal, vol. 34, No. 4, Apr. 1983, pp. 23-34.
Adamian, V. et al., "Simplified Noise Evaluation of Microwave Receiver," IEEE Transactions on Instrumentation and Measurement, vol. IM-33, No. 2, Jun. 1984, 136-140.
Pastori, William E., "High accuracy microwave noise figure measurements," 8029 Electronic Engineering 56, No. 1984, pp. 181-189.
Inter-Continental Microwave, "Producr Catalog," VMC 1055 Jan. 1986.
Design Technique, "Microstrip Microwave Test Fixture," May 1986.
Cascade Microtech, Inc., "Wide Probe Assembly," Full Scale Drawing, May 29, 1986, 2 pages.
Jackson, Robert et al., "Surface-to-Surface Transition via Electromagnetic Coupling of Coplanar Waveguides," Nov. 1987, 8099 IEEE Transactions on Microwave Theory and Techniques MTT-35, pp. 1027-1032.
Sharma, A., "Tunable Waveguide-to-Microstrip Transition for Millimeter-Wave Applications," IEE MTT-S Digest 1987, pp. 353-356.
Izadian, Jamal S., "Unified Design Plans Aid Waveguide Transitions," Microwaves & R&F, May 1987, pp. 213-222.
Mazilu, T., "A Self-Adjusting Waveguide-to-Microstrip Transition," Microwave Journal, Jul. 1987, pp. 133-134.
Carlton, D.E. et al., "Accurate Measurement of High-speed Package and Interconnect Parasitics," IEEE 1988 Custom Integrated Circuits Conference, pp. 23.3.1-23.3.6.
Fraser, Artur, et al., "GHz On-Silicon-Wafer Probing Calibration Methods," Paper 7.6, IEEE 1988 Bipolar Circuits & Technology Meeting, pp. 154-157.
Modolo, John A., et al, "Wafer level high-frequency measurements of photodetector characteristics," Applied Optics, vol. 27 pp. 3059-3061, Aug. 1988.
Design Technique, "Adjustable Test Fixture," 1988.
Tong, Peter R., et al., "Noise Measurements at MM-Wave Frequencies," 176 Microwave Journal 31, Jul. 1988.
Barsotti, C., et al., "New Probe Cards Replace Needle Types," Semiconductor International, Aug. 1988, pp. 98-101.
Microwave Journal, "Microwave Products," Sep. 1988, pp. 297.
Cascade Microtech Microprobe Update, "Spurious propagation, modes removed by probe absorber," Apr. 1989.
Esteban, J., et al., "Mode Spectrum of Waveguides Using A Transverse S-Matrix Resonance Method," AP-S International Symposium 1989, IEEE Catalog No. CH-2654-2189, San Jose, CA, Jun. 26-30, 1989, pp. 1263-1267.
Ponchak, George, et al., "A New Rectangular Waveguide to Coplaner Waveguide Transition," Prepared for 1990 IEEE MTT-S International Microwave Symposium to be held between May 8-10, 1990 in Dallas, Texas, Jan. 1990.
Dalman, G.C., "New Waveguide-to-Coplaner Waveguide Transition for Centimetre and Millimetre Wave Applications," Electronics Letters, Jun. 21, 1990, vol. 26, No. 13.
Cascade Microtech WPH-700 series, "Multicontact High-Speed Integrated Circuit," 1991, 700S-591.
Liu, S.M. Joseph, et al., "A New Probe for W-band On-wafer Measurements," IEEE MTT-S Digest, 1993, pp. 1335-1338.
Photo of Micromanipulator Probe Station, 1994.
Maury Microwave Corp., Transistor Test Fixture (TTF) MT950 Series, May 31, 1995, Advanced Data, 4T-0011.
Cascade Microtech, "Layout rules for WPH-900 Series probes," Applications Note, 1996.
Cascade Microtech, "Air coplanar Probe Series," 1997.
Yong-Dae, Kim, et al. "Fabrication of silicon Micro-Probe for Vertical Probe Card Application," Jpn. J. Appl. Phys. vol. 37, Part 1, No. 12B, Dec. 1998, pp. 7070-7073.
"A Broadband Microwave choke," Microwave Journal, Dec. 1999.
"The Air Coplanar Probe offers a highly compliant, rugged probe with lowest insertion loss available," Cascade Microtech, Inc., Air coplanar Probe Series, 2000.

Cascade Microtech, "On-Wafer Test Solutions for State-of-the-Art Electro-Optical Components," 2001.

Purroy, F. et al., "New Theoretica Analysis of the LRRm Calibration Technique for Vector Network Analyzers," IEEE Transactions on Instrumentation and Measurement, vol. 50, No. 5, Oct. 2001, pp. 1307-1313.

"Laser Diode Test Solution," Oct. 9, 2002, http:/www.cascademicrotech.com/index.cfm/fuseaction/pg.view/plD/136.

Liang, Qingqing, et al., "Accurate ac Transistor Characterization to 110 GHz Using a New Four-port Self-Calibrated Extraction Technique," 2004 Topical Meeting on Silicon Monolitic Integrated Circuits in RF Systems, pp. 282-285.

Basu, S., et al, "A Membrane Quandrant Probe for R&D Applications," Cascade Microtech, Inc. At Least one year prior to filing.

Electrical Operation, Calibration and Measurement Steps with the HP 8510, At least one year prior to filing.

Whinnery, J.R. et al., "Equivalent Circuits for Discontinuities in Transmission Lines," Proceedings of IRE, at least one year prior to filing.

Inter-Continental Microwave, Application Note: 101, Microwave Semiconductor Chip Measurements using the HP 8510B TRL-Calibration Technique, at least one year prior to filing.

Cascade Microtech, "Special Purpose Probe 40/80 Gb/s High Performance Quandrant," at least one year prior to filing.

Agilent Technology Product Information, HPW281D Waveguide Adapter, 1 mm (m) to W- Band, 75 GHz to 110 GHz.

Cascade Microwave, "Introducing the World's First Microwave Wafer Probing Equipment," 4 pages, 1983.

Malm, R.L. "Reduction of Stray Fields About SEM Samples," IBM Technical Disclosure Bulletin, vol. 21, No. 7, Dec. 1978 2 pages.

Kuhn, Nick, "Accurate and Automatic Noise Figure Measurements with Standard Equipment," Hewlett-Packard co., Inc., Stanford Park Division 1501 Page Mill Road, Palo Alto, CA 94304, 3 pages Conference: Technology Grow for the 80's. 1980 IEEE MTT-S International Microwave Symposium Digest, Washington, DC, May 28-30, 1980.

International Search Report for PCT/US06/16238 mailed Feb. 28, 2007.

Written Opinion of the International Searching Authority for PCT/US06/16238, mailed Feb. 28, 2007.

Partial International Search Report for PCT/US2005/039561, mailed Mar. 21, 2006.

International Search Report for PCT/US2005/039561, mailed May 18, 2006.

Written Opinion of the International Searching Authority for PCT/US2005/039561, mailed May 18, 2006.

Mark S. Boguski and Martin W. McIntosh, "Biomedical informatics for proteomics," insight: review article, Nature 422, 233-237 (2003); doi:10.1038/nature01515.

Daniel Vanderweide, "THz Frequency Science & Technology Biomolecular Interaction Sensing with Sub-Terahertz Fields," University of Wisconsin-Madison, 2 pages, date unknown.

L.L. Sohn, O.A. Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.

Sam Hanash, "insight review articles, Disease proteomics," Nature, vol. 422, Mar. 13, 2003, pp. 226-232.

Mike Tyers and Matthias Mann, "insight overview, From genomics to proteomics," Nature, vol. 422, Mar. 13, 2003, pp. 193-197.

Andrej Sali, Robert Glaeser, Thomas Earnest, and Wolfgang Baumeister, "insight: review article From words to literature in structural proteomics," Nature 422, 216-225 (2003); doi: 10.1038/nature01513.

Ruedi Aebersold and Matthias Mann, "insight review articles, Mass spectrometry-based proteomics," Nature, vol. 422, Mar. 13, 2003, pp. 198-207.

Barbara Marte, Senior Editor, "Nature insight Proteomics," Nature vol. 422, Mar. 13, 2003 pp. 191-194.

Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512.

Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christophe Risacher, et al., "Waveguide-to-Microstrip Transition With Integrated Bias-T," IEEE Microwave and Wireless Components Letters, vol. 13, No. 7, Jul. 2003, pp. 262-264.

Saswata Basu and Leonard Hayden, "An SOLR Calibration for Accurate Measurement of Orthogonal On-Wafer DUTS," 1997 IEEE MTT-S Digest, pp. 1335-1338.

J. Martens, "Multiport SOLR Calibrations: Performance and an Analysis of Some Standards Dependencies," pp. 205-213, Anritsu Company, 490 Jarvis Drive, Morgan Hill, CA 95037, jmartens@anritsu.com.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R. N. Clarke, "The Measurement of the Properties of Materials," Proceedings of the IEEE, vol. 74, No. 1, Jan. 1986, pp. 183-199.

M.S. Venkatesh and G.S.V. Raghavan, "An overview of dielectric properties measuring techniques," vol. 47, 2005, Canadian Biosystems Engineering, pp. 7.15-7.30.

Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL—A New concept in Microwave Measurements: Theory and Experimental Verification," IEEE Transactions On Microwave Theory and Techniques, vol. 46, No. 5, May 1998, pp. 536-542.

Roberto Tinti, Franz Sischka, and Chris Morton, "Proposed System Solution for 1/f Noise Parameter Extraction," Agilent Technologies Comms EDA, 1400 Fountaingrove Pkw, Santa Rosa, CA 95403, 7 pages.

Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Institute of Physics, pp. 1354-1356.

Cascade Microtech, "Probe Heads Care and cleaning of coaxial input microwave probes," Microwave Probe Care and Cleaning, Instruction Manual, Copyright 1990.

\* cited by examiner

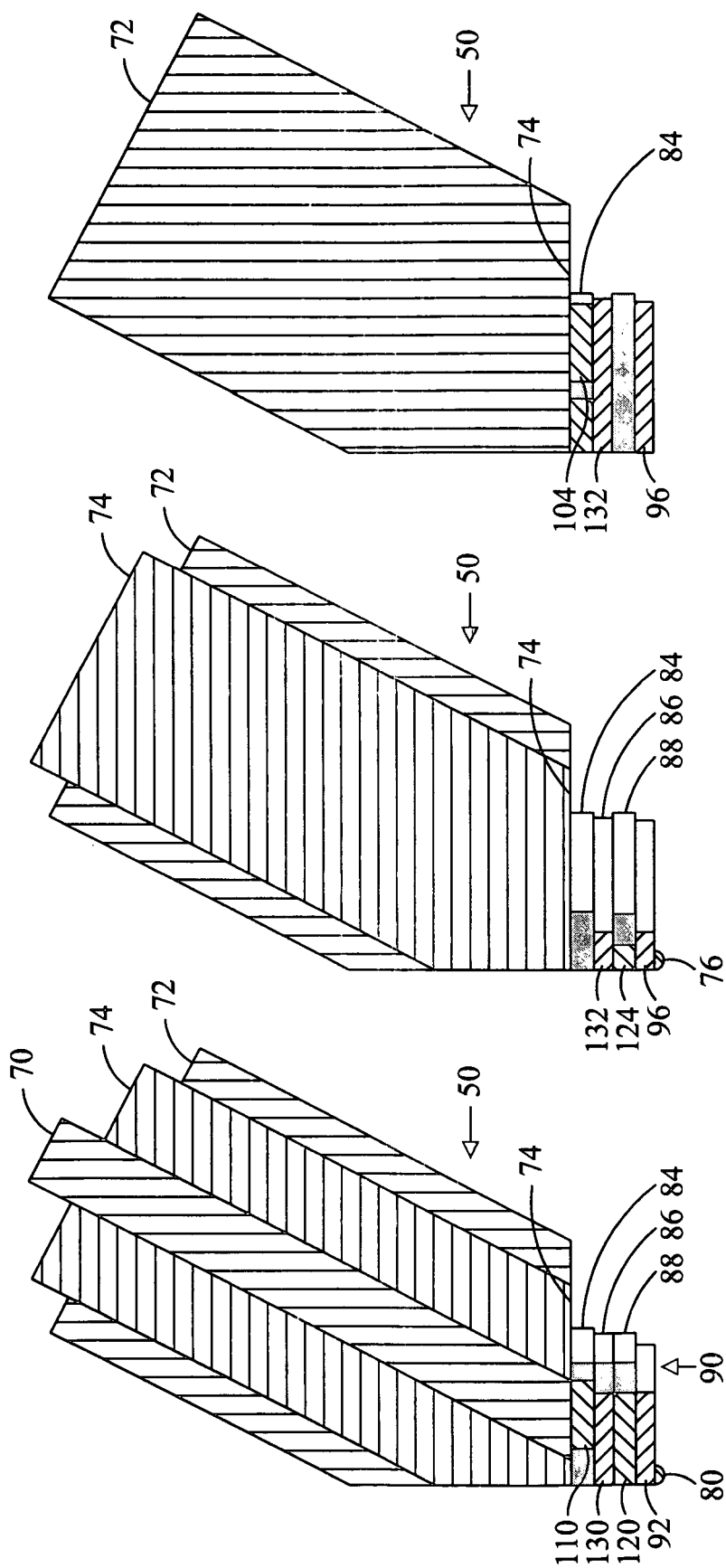

PROBE FOR HIGH FREQUENCY SIGNALS

CROSS-REFERENCE TO RELATED APPLICATIONS

This application claims the benefit of U.S. Provisional Application No. 60/688,821, filed Jun. 8, 2005.

BACKGROUND OF THE INVENTION

The present invention relates to probe measurement systems for measuring the electrical characteristics of integrated circuits and other electronic devices operated at high frequencies.

There are many types of probing assemblies that have been developed for the measuring the characteristics of integrated circuits and other forms of microelectronic devices. One representative type of assembly uses a circuit card on the upper side of which are formed elongate conductive traces that serve as signal and ground lines. A central opening is formed in the card, and a needle-like probe tip is attached to the end of each signal trace adjacent the opening so that a radially extending array of downwardly converging needle-like tips is presented by the assembly for selective connection with the closely spaced pads of the microelectronic device being tested. A probe assembly of this type is shown, for example, in Harmon, U.S. Pat. No. 3,445,770. This type of probe does not exhibit resistive characteristics over a broad frequency range. At higher frequencies, including microwave frequencies in the gigahertz range, the needle-like tips act as inductive elements and the inductance is not counteracted by a capacitive effect from adjoining elements. Accordingly, a probing assembly of this type is unsuitable for use at microwave frequencies due to the high levels of signal reflection and substantial inductive losses that occur at the needle-like probe tips.

In order to obtain device measurements at somewhat higher frequencies than are possible with the basic probe card system described above, various related probing systems have been developed. Such systems are shown, for example, in Evans, U.S. Pat. No. 3,849,728; Kikuchi, Japanese Publication No. 1-209,380; Sang et al., U.S. Pat. No. 4,749,942; Lao et al., U.S. Pat. No. 4,593,243; and Shahriary, U.S. Pat. No. 4,727,319. Yet another related system is shown in Kawanabe, Japanese Publication No. 60-223,138 which describes a probe assembly having needle-like tips where the tips extend from a coaxial cable-like structure instead of a probe card. A common feature of each of these systems is that the length of the isolated portion of each needle-like probe tip is limited to the region immediately surrounding the device-under-test in order to minimize the region of discontinuity and the amount of inductive loss. However, this approach has resulted in only limited improvement in higher frequency performance due to various practical limitations in the construction of these types of probes. In Lao et al., for example, the length of each needle-like tip is minimized by using a wide conductive blade to span the distance between each tip and the supporting probe card, and these blades, in turn, are designed to be arranged relative to each other so as to form stripline type, transmission line structures. As a practical matter, however, it is difficult to join the thin vertical edge of each blade to the corresponding trace on the card while maintaining the precise face-to-face spacing between the blades and the correct pitch between the ends of the needle-like probe tips.

One type of probing assembly that is capable of providing a controlled-impedance low-loss path between its input terminal and the probe tips is shown in Lockwood et al., U.S. Pat. No. 4,697,143. In Lockwood et al., a ground-signal-ground arrangement of strip-like conductive traces is formed on the underside of an alumina substrate so as to form a coplanar transmission line on the substrate. At one end, each associated pair of ground traces and the corresponding interposed signal trace are connected to the outer conductor and the center conductor, respectively, of a coaxial cable connector. At the other end of these traces, areas of wear-resistant conductive material are provided in order to reliably establish electrical connection with the respective pads of the device to be tested. Layers of microwave absorbing material, typically containing ferrite, are mounted about the substrate to absorb spurious microwave energy over a major portion of the length of each ground-signal-ground trace pattern. In accordance with this type of construction, a controlled high-frequency impedance (e.g., 50 ohms) can be presented at the probe tips to the device under test. Broadband signals that are within the range, for example, of DC to 18 gigahertz (GHz) can travel with little loss from one end of the probe assembly to another along the coplanar transmission line formed by each ground-signal-ground trace pattern. The probing assembly shown in Lockwood et al. fails to provide satisfactory electrical performance at higher microwave frequencies and there is a need in microwave probing technology for compliance to adjust for uneven probing pads.

Several high-frequency probing assemblies have been developed for improved spatial conformance between the tip conductors of the probe and an array of non-planar probe pads or surfaces. Such assemblies are described, for example, in Drake et al., U.S. Pat. No. 4,894,612; Coberly et al., U.S. Pat. No. 4,116,523; and Boll et al., U.S. Pat. No. 4,871,964. The Drake et al. probing assembly includes a substrate on the underside of which are formed a plurality of conductive traces which collectively form a coplanar transmission line. However, in one embodiment shown in Drake et al., the tip end of the substrate is notched so that each trace extends to the end of a separate tooth and the substrate is made of moderately flexible non-ceramic material. The moderately flexible substrate permits limited independent flexure of each tooth relative to the other teeth so as to enable spatial conformance of the trace ends to slightly non-planar contact surfaces on a device-under-test. However, the Drake et al. probing assembly has insufficient performance at high frequencies.

With respect to the probing assembly shown in Boll et al., as cited above, the ground conductors comprise a pair of leaf-spring members the rear portions of which are received into diametrically opposite slots formed on the end of a miniature coaxial cable and which are electrically connected with the cylindrical outer conductor of that cable. The center conductor of the cable is extended beyond the end of the cable (i.e., as defined by the ends of the outer conductor and the inner dielectric) and is gradually tapered to form a pin-like member having a rounded point. In accordance with this construction, the pin-like extension of the center conductor is disposed in a spaced apart, generally centered position between the respective forward portions of the leaf-spring members and thereby forms, in combination with these leaf-spring members, a rough approximation to a ground-signal-ground coplanar transmission line structure. The advantage of this particular construction is that the pin-like extension of the cable's center conductor and the respective forward portions of the leaf-spring members are each movable independently of each other so that the ends of these respective members are able to establish spatially conforming contact with any non-planar contact areas on a device being tested. On the other hand, the transverse-spacing between the pin-like member and the respective leaf-spring members will vary depending on how forcefully the ends of these members are urged against the contact pads of the device-under-test. In other words, the transmission characteristic of this probing structure, which is dependent on the spacing between the respective tip members, will vary in an ill-defined manner during each probing cycle, especially at high microwave frequencies.

Burr et al., U.S. Pat. No. 5,565,788, disclose a microwave probe that includes a supporting section of a coaxial cable including an inner conductor coaxially surrounded by an outer conductor. A tip section of the microwave probe includes a central signal conductor and one or more ground conductors, generally arranged in parallel relationship to each other along a common plane with the central signal conductor, to form a controlled impedance structure. The signal conductor is electrically connected to the inner conductor and the ground conductors are electrically connected to the outer conductor of the coaxial cable. A shield member is interconnected to the ground conductors and covers at least a portion of the signal conductor on the bottom side of the tip section. The shield member is tapered toward the tips with an opening for the tips of the conductive fingers. The signal conductor and the ground conductors each have an end portion extending beyond the shield member and, despite the presence of the shielding member, the end portions are able to resiliently flex relative to each other and away from their common plane so as to permit probing of devices having non-planar surfaces.

In another embodiment, Burr et al. disclose a microwave probe that includes a supporting section of a coaxial cable including an inner conductor coaxially surrounded by an outer conductor. A tip section of the microwave probe includes a signal line extending along the top side of a dielectric substrate connecting a probe finger with the inner conductor. A metallic shield may be affixed to the underside of the dielectric substrate and is electrically coupled to the outer metallic conductor. Ground-connected fingers are placed adjacent the signal line conductors and are connected to the metallic shield by way of vias through the dielectric substrate. The signal conductor is electrically connected to the inner conductor and the ground plane is electrically connected to the outer conductor. The signal conductor and the ground conductor fingers (connected to the shield by vias) each have an end portion extending beyond the shield member and, despite the presence of the shielding member, the end portions are able to resiliently flex relative to each other and away from their common plane so as to permit devices having non-planar surfaces to be probed. While the structures disclosed by Burr et al. are intended to provide uniform results over a wide frequency range, they unfortunately tend to have non-uniform response characteristics at high microwave frequencies.

Gleason et al., U.S. Pat. No. 6,815,963 B2, disclose a probe comprising a dielectric substrate that is attached to a shelf cut in the underside of a coaxial cable. The substrate projects beyond the end of the cable in the direction of the longitudinal axis of the cable. A signal trace for conducting a test signal between the center conductor of the coaxial cable and a probing or contact pad on the device under test (DUT) is formed on the upper side of the substrate. At the distal end of the signal trace, near the distal edge of the substrate, a via, passing through the substrate, conductively connects the signal trace to a contact bump or tip that will be brought into contact with the contact pad of the DUT during probing. A conductive shield which is preferably planar in nature is fixed to the bottom surface of the substrate and electrically connected to the outer conductor of the coaxial cable. The conductive shield is typically coextensive with the lower surface of the substrate with the exception of an aperture encircling the contact tip for the signal trace. Contact tips may also be provided for contacting ground contact pads spaced to either side of the signal probe pad on the DUT. Compared to coplanar type probes, this probe tip provides superior electromagnetic field confinement and reduces unwanted coupling or cross talk between the probe's tips and with adjacent devices. However, at high frequencies, approximately 220 GHz and greater, the length of the conductive interconnection between the probe tip and the coaxial cable connection becomes a significant fraction of the wavelength of the signal and the interconnection acts increasingly as an antenna, emitting increasingly stronger electromagnetic fields that produce undesirable coupling paths to adjacent devices. In addition, the conductive interconnection comprises a single metal layer deposited on the dielectric substrate and the relatively small section of the conductive interconnection limits the current carrying capacity of the probe.

What is desired, therefore, is a probe tip for an on-wafer probe enabling probing at higher frequencies, reducing stray electromagnetic fields in the vicinity of the probe tip to reduce cross talk with adjacent devices and capable of conducting a substantial current.

BRIEF DESCRIPTION OF THE DRAWINGS

FIG. 4 is a section view of the probe tip of FIG. 3 along A-A.

FIG. 5 is a section view of the probe tip of FIG. 3 along B-B.

FIG. 6 is a section view of the probe tip of FIG. 3 along C-C.

DETAILED DESCRIPTION OF PREFERRED EMBODIMENTS

The present inventors considered the probe disclosed by Gleason et al.; U.S. Pat. No. 6,815,963 B2; incorporated herein by reference, and concluded that while the probe provides superior performance, the high frequency performance of the probes are constrained by the length of the conductors that interconnect the probe tips and the coaxial cable of the probe. In a time-varying electromagnetic field, a conductor acts as an antenna radiating electromagnetic energy. For an antenna shorter than one wavelength of a signal, the radiated power is roughly proportional to the length of the antenna. The energy radiated by the conductive interconnection increases as the frequency of the signal increases and as the fixed length of the interconnecting conductor represents an increasingly larger fraction of the decreasing wavelength of the signals. The in-air wavelength of a 220 gigahertz (GHz) signal is 1.3 millimeters (mm). The length of the conductive interconnection of the probe disclosed by Gleason et al. is a significant fraction of this distance and substantial electromagnetic fields have been confirmed along the edges of the dielectric membrane in the vicinity of the contact tips.

When multiple probes are used for probing in a confined area, such as the contact pads of an individual device on a wafer, the probe tips come into close proximity with one another and energy radiated by the probes produces capacitive coupling of the probes, normally referred to as cross-talk. Crosstalk increases as the frequency of the signal increases because the energy radiated by the probe increases. The inventors concluded that reducing the length of the conductive elements in the probe tip would reduce the electromagnetic fields emanating from the contact tip area of the probe, reducing cross-talk with adjacent devices, and increasing the frequency at which the probe would be useful.

Figure 1:
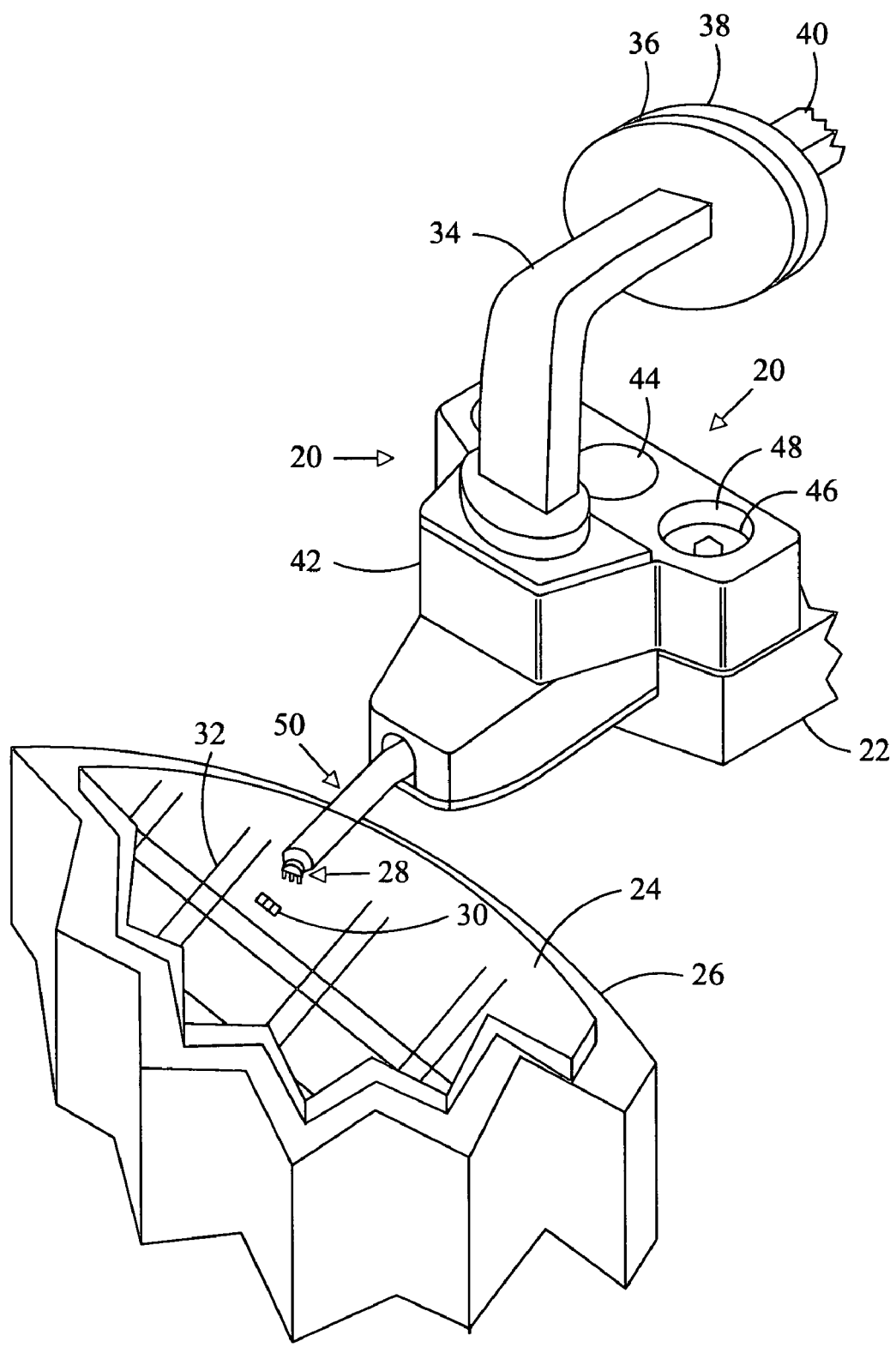
FIG. 1 is a partial perspective view of a probe station including a high frequency probe and a wafer to be tested.
Figure 2:
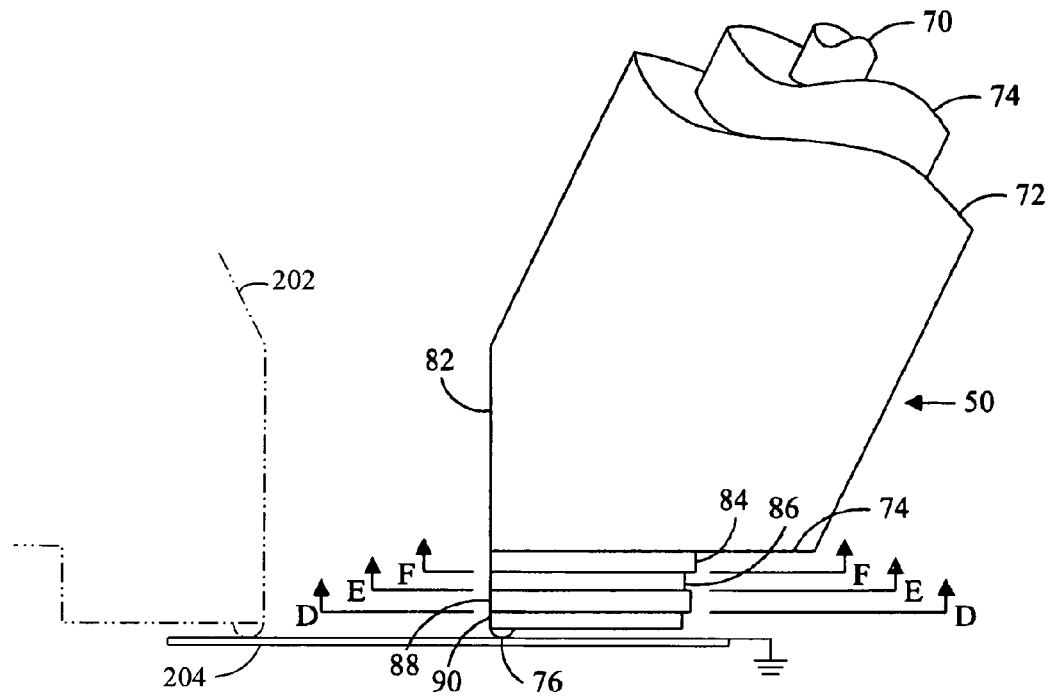
FIG. 2 is an elevation view of an exemplary probe tip portion of a high frequency probe.
Figure 3:
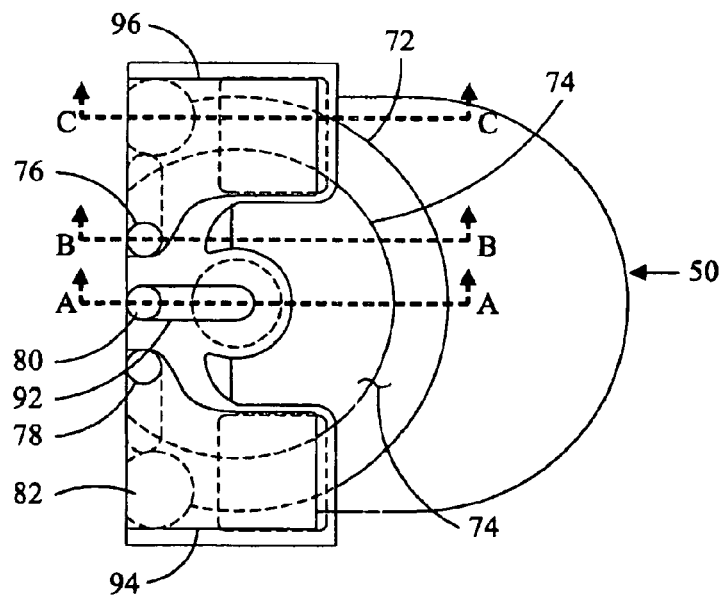
FIG. 3 is a bottom view of the probe tip of FIG. 2.
Figure 9:
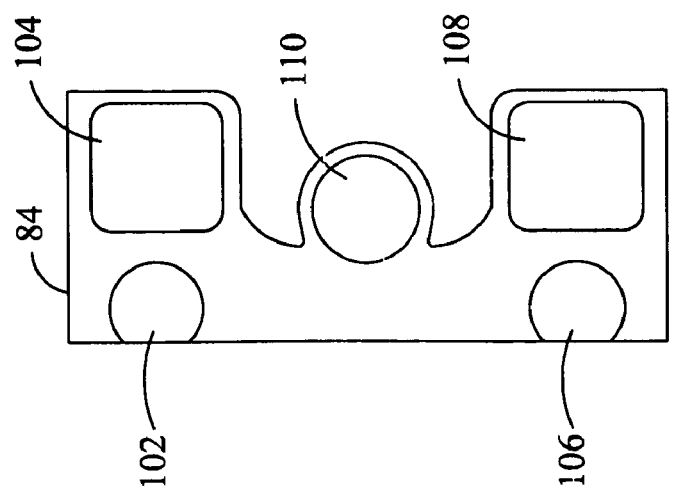
FIG. 9 is a section view of the probe tip of FIG. 2 along F-F.
Figure 8:
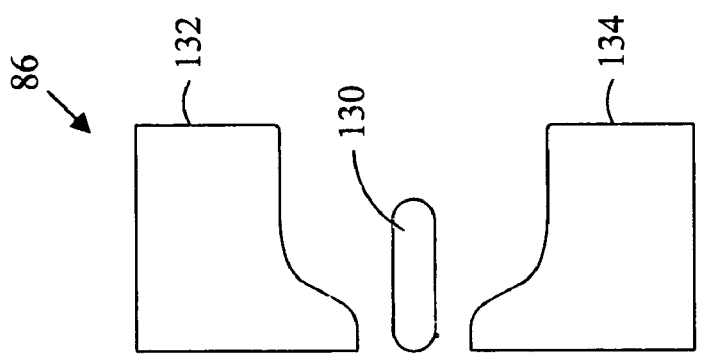
FIG. 8 is a section view of the probe tip of FIG. 2 along E-E.
Figure 7:
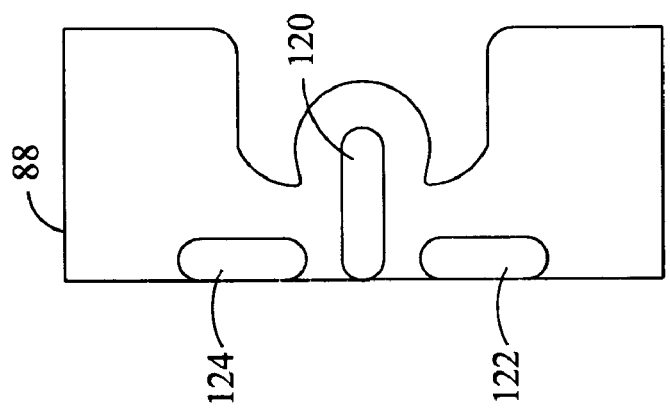
FIG. 7 is a section view of the probe tip of FIG. 2 along D-D.

Referring in detail to the drawings where similar parts of the probe are identified by like reference numerals and, more particularly to FIGS. 1, 2 and 3, a high frequency probe 20 is designed to be mounted on a probe-supporting member 22 of a probe station so as to be movable to a suitable position for probing a device-under-test (DUT), such as an individual component on a wafer 24. In this type of application, the wafer is typically restrained on the upper surface of a chuck 26 which is part of the same probe station. The upper surface of the chuck commonly includes a plurality of apertures that are selectively connectible to a source of vacuum. When vacuum is connected to the apertures, air pressure on a wafer, resting on the upper surface of the chuck, secures the wafer to the chuck's surface. Ordinarily an X-Y-Z positioning mechanism, such as a micrometer knob assembly, is provided to effect movement between the supporting member 22 and the chuck 26 so that the contact tips 28 of the probe can be brought into pressing engagement with contact or probing pads 30 on the wafer. The contact pads typically comprise a signal contact pad and at least one ground contact pad for a particular component 32 requiring measurement. A common contact pad arrangement comprises a centrally located signal contact pad flanked by a pair of ground contact pads, also referred as a GSG (ground-signal-ground) probing configuration.

The exemplary high frequency probe 20 has a port which, in the preferred embodiment depicted, comprises a waveguide 34 having a flanged connector 36. The flanged connector enables selective connection, through a mating flanged connector 38, to an external waveguide 40 connecting the probe to the measuring instrumentation. The waveguide is connected to a primary support block 42 of the probe which, in the preferred embodiment shown, is made of brass and is suitably constructed for connection to the probe-supporting member 22. To effect connection to the probe-supporting member, a round opening 44 that is formed on the block is snugly and slidably fitted onto an alignment pin (not shown) that projects upward from the probe-supporting member. A screw 46 is inserted into each of a pair of countersunk openings 48 provided in the block. The screws engage corresponding threaded apertures in the probe-supporting member to secure the probe to the supporting member.

A semi-rigid coaxial cable 50 is retained in the primary support block 42 and is connected, within the block, to the waveguide 34 by a coaxial cable-to-waveguide transition; such the adjustable backshort disclosed by Martin, U.S. Pat. No. 6,549,106 B2, incorporated herein by reference. In the preferred embodiment, the semi-rigid coaxial cable 50 has a nominal outer diameter of 0.584 mm (0.023 inches) and comprises an axially extending silver plated copper center conductor 70 and a coaxial copper outer conductor 72 separated from the center conductor by an air-expanded Teflon™ dielectric 74. One suitable type of cable, for example, is available from Micro-coax Components Inc. of Pottstown, Pa. under model number UT-020.

The end portion of the cable 50 projecting from the support block remains freely suspended and, in this condition, serves as a movable support for the contact tips 28 of the probe. A portion of the cable protruding from the primary support block is bent downwardly and is terminated in an oblique terminal section 74 formed by cutting the coaxial cable at an oblique angle. While the oblique angle could be any convenient angle, the angle is typically the complement of angle of the downward sloping portion of the coaxial cable so that when the probe is installed in a probe station the substantially planar oblique terminal section 74 will be aligned substantially parallel to the top surface of the chuck 26.

The inventors concluded that to reduce the stray electric fields ("E-fields") and magnetic fields ("H-fields") in the vicinity of the probe tip the distance between the ends of the contact tips and the conductors of the coaxial cable should be minimized and the contact tips should be located in an area shielded by the outer conductor of the coaxial cable. The contact pads of devices commonly tested in probe stations are commonly arranged in rows with a centrally located signal contact pad flanked by a pair of ground contact pads, a GSG (ground-signal-ground) arrangement. The three contact tips 76, 78, 80 of the exemplary probe 20 correspond to a GSG arrangement for contacts pads with the central contact tip 80 of the exemplary probe, the signal tip of the GSG arrangement, conductively connected to the center conductor 70 of the coaxial cable 50 and the flanking contact tips 76, 78, on either side of the central contact tip, conductively connected to the outer conductor 72 of the coaxial cable which is connected to a ground. However, other arrangements of contact tips corresponding to other arrangements of contact pads, for examples a GSSG (ground-signal-signal-ground) arrangement, an SGS (signal-ground-signal) arrangement or an SGGS (signal-ground-ground-signal) arrangement, may be used. To improve shielding and reduce the lengths of conductive connections to the coaxial cable, the contact tips of the high frequency probe 20 are located within the periphery of the coaxial cable and, more specifically, within the periphery of the oblique terminal section 74 of the coaxial cable.

When positioning the contact tips of a probe in a probe station, the operator typically observes the contact tips of the probe and the contact pads of the DUT through a microscope that is positioned above the DUT. To minimize the conductor length while enabling visual observation of the contact tips, the end portion of the coaxial cable further comprises a second oblique section 82 produced by cutting the coaxial cable at a second oblique angle, typically normal to the oblique terminal section 74. The second oblique section 82 intersects the oblique terminal section 74 adjacent to the edge of the contact tips 76, 78, 80 enabling the operator to view the edges of the contact tips from above.

Referring to FIGS. 4, 5, 6, 7, 8 and 9, the tip portion of the probe 20 further comprises a planar upper dielectric substrate 84 affixed to the coaxial cable 50 and having an upper surface abutted to the oblique terminal section 74 of the cable. The upper dielectric substrate may be affixed to the coaxial cable by, for example, an epoxy adhesive applied to the upper surface of the substrate along the periphery of the cable and solder joining metallic vias 102, 104, 106, 108 in the substrate to the metallic outer conductor 72 of the cable. The upper dielectric substrate 84 has a lower surface which is bonded to, by plating or otherwise, an upper surface of an upper conductive layer 86, comprising three typically metallic, conductively disconnected regions 130, 132, 134. The lower surface of the upper conductive layer 86 is, in turn, bonded to an upper surface of a lower dielectric layer 88 and a lower conductive layer 90 is bonded to the lower surface of the lower dielectric layer. The contact tips 76, 78, 80, which may comprise metallic bumps or buttons, are formed on or conductively affixed to the lower surfaces of respective portions of the lower conductive layer 90.

The lower conductive layer 90 comprises three conductive, typically metallic, regions 92, 94, 96 that are not conductively connected to each other. A first region 92 includes a portion, at least partially, spatially coinciding with and conductively connected to the central contact tip 80, the signal contact tip of the GSG probe arrangement. The second 94 and third 96 regions of the lower metallic layer are respectively conductively connected to a contact tip 76, 78 located on either side of the central tip. The second 94 and third 96 regions of the lower conductive layer 90 are conductively connected to the outer conductor 72 of the coaxial cable 50 which is connected to a ground in the typical GSG probing arrangement. The second 92 and third 94 regions of the lower conductive layer effectively extend the outer conductor of the coaxial cable to the immediate vicinity of the signal contact tip forming a conductive shield that extends over an area of the cable's terminal section that is substantially larger than the area of the ground contact tips and proximate to the signal contact tip 80. The conductive shield confines electromagnetic radiation in the immediate area of the contact tips.

The central contact tip 80 is conductively connected to the center conductor 70 of the coaxial cable by conductors that are arranged within the periphery of the terminal section of the coaxial cable and extend through the upper and lower dielectric layers and the upper conductive layer. A conductive via 120 in the lower dielectric layer 88 that is at least partially spatially coincident with and conductively connected to the first region 92 of the lower conductive layer 90 connects the first region of the lower conductive layer to a first region 130 of the upper conductive layer 86. A conductive via 110 in the upper dielectric substrate 84 that is, at least partially, spatially coincident with and conductively connected to the first region 130 of upper conductive layer 86 conductively connects the first region of the upper conductive layer and the central contact tip 80 to the center conductor 70 of the coaxial cable 80. The cross-sections of the conductive interconnection of the central contact tip 80 and the coaxial cable are substantially greater than that of a conductor comprising a single metal layer deposited on a substrate permitting higher current to be transmitted by the contact tips.

Similarly, the flanking contact tips 76, 78 are conductively connected to the outer conductor of the coaxial cable 50 by respective conductive vias 124, 122 in the lower dielectric layer 88 that are, conductively connected to, respective, second 96 and third 94 regions of the lower conductive layer 90 and with the corresponding second 132 and third 134 regions of the upper conductive layer 86. Conductive vias 102, 104 and 106, 108 in the upper dielectric layer 84 provide a conductive connection between the second 132 and third 134 regions of the upper conductive layer 84 and the outer conductor 72 of the coaxial cable 50. The conductive connections from the flanking contact tips to the outer conductor of the coaxial cable are arranged substantially with the periphery of the terminal section of the cable enabling pluralities of probes to be used to probe of areas.

Figure 10:
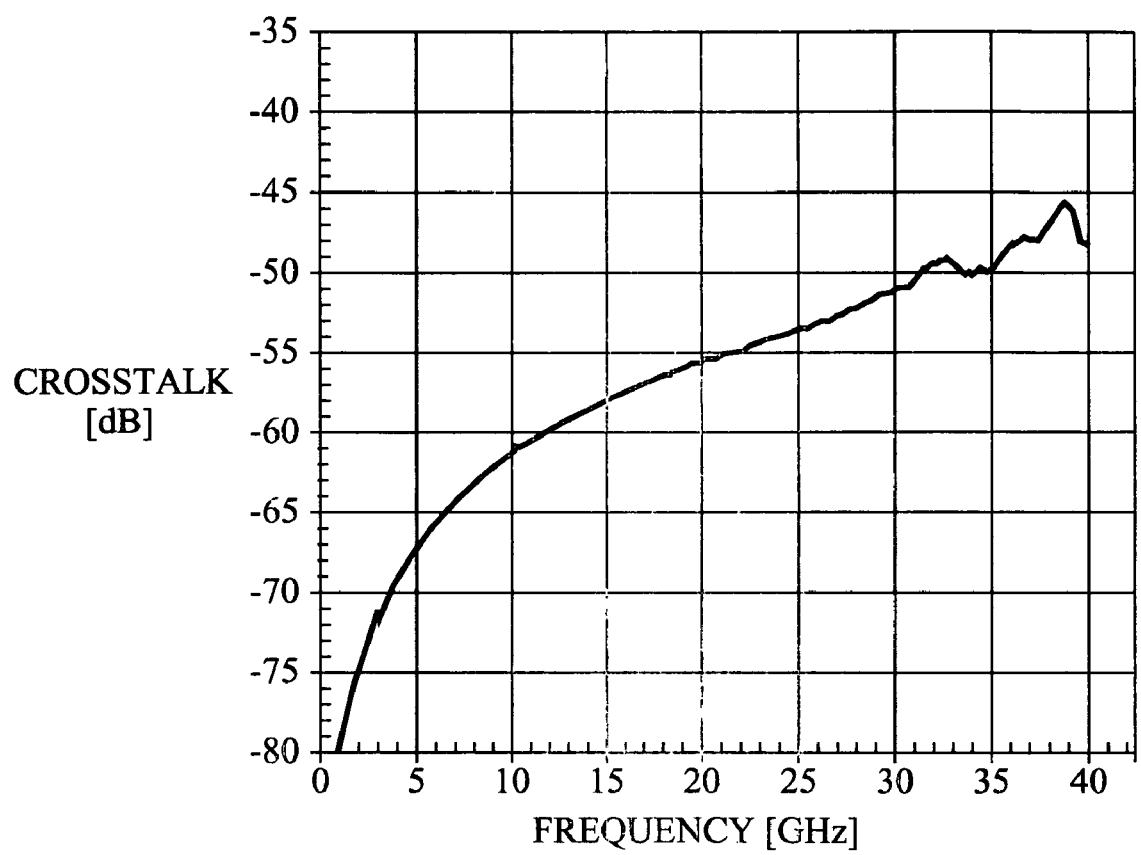
FIG. 10 is a graphical illustration of crosstalk between a pair of high frequency probes having tips shorted on a test structure.

Stray E-fields in the area of the probe tip produce capacitive coupling to or crosstalk with adjacent devices at frequencies well below the resonant frequency of the probe tip. The crosstalk worsens as the frequency of the signal increases and the stray fields strengthen. At any particular frequency, the worst case crosstalk occurs when adjacent probes are terminated with short circuits on a test substrate. FIG. 10 graphically illustrates tip-to-tip crosstalk between a pair high frequency probes, exemplified by the high frequency probe 20, at signal frequencies up to 40 GHz. FIG. 10 records tip-to-tip crosstalk for two high frequency probes 50, 202 (illustrated in phantom) with probe tips separated by 150 micrometers (μm) on a continuous ground structure 204, as illustrated in FIG. 2. Exemplary values of tip-to-tip crosstalk for the high frequency probes are −58 dB at 15 GHz and approximately −51 dB at 30 GHz. Over the frequency range of 5 to 40 GHz, the tip-to-tip crosstalk of the high frequency probes is approximately 10 dB less than probe tips of the type disclosed by Gleason et al.

The conductive connections between the contact tips and the conductors of the coaxial cable of the high frequency probe are substantially shorter than the conductive interconnections of prior probes reducing the conductor length-to-wavelength ratio and the power radiated by the probe's conductors when high frequency signals are applied. In addition, the high frequency probe incorporates shielding for the contact tips to confine energy radiated from the area of the probe tip. The useable frequency range of the probe is extended and crosstalk to adjacent probes is substantially reduced by the reduction in and confinement of energy radiated from the vicinity of the probe tip. Moreover, the cross-sections of the conductive interconnections from the contact tips to the coaxial cable are substantially greater than the cross-sections of the single layer conductive interconnections of prior probes substantially increasing the current carrying capacity of the probe.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

The invention claimed is:

1. A probe comprising:
   (a) a coaxial cable including an axially extending first conductor, a coaxial second conductor and a dielectric, said coaxial cable terminating in a terminal section oblique to a longitudinal axis of said coaxial cable;
   (b) a dielectric substrate affixed to said coaxial cable with a first side proximate said terminal section and a second side remote from said terminal section;
   (c) a first conductive member conductively connecting said first conductor to a first contact located on said second side of said dielectric substrate, nearer a periphery of said terminal section than a center of said terminal section and substantially within said periphery of said terminal section, said first contact engageable with a device to be tested; and
   (d) a second conductive member conductively connecting said second conductor to a second contact located on said second side of said dielectric substrate, nearer said periphery of said terminal section than said center of said terminal section and substantially within said periphery of said terminal section.

2. The probe of claim 1 wherein said first conductive member is located substantially within said periphery of said terminal section.

3. The probe of claim 2 wherein said second conductive member is located substantially within said periphery of said terminal section.

4. The probe of claim 1 further comprising a third contact conductively connected to said second conductor and located substantially within said periphery of said terminal section on said second side of said dielectric substrate.

5. The probe of claim 4 wherein said conductive connection of said third contact to said second conductor is located substantially within said periphery of said terminal section.

6. The probe of claim 1 wherein said oblique terminal section comprises:
   (a) a first oblique substantially planar section of said coaxial cable; and
   (b) an intersecting second oblique section of said coaxial cable.

7. The probe of claim 6 wherein said second oblique section intersects said first oblique planar section proximate said first contact.

8. The probe of claim 6 wherein said second oblique section is substantially normal to said first oblique planar section.

9. The probe of claim 1 wherein said second conductive member further comprises a planar portion adjacent to but free of conductive connection with said first contact.

10. The probe of claim 9 wherein said second conductive member is conductively connected to a ground.

11. The probe of claim 1 wherein said dielectric substrate comprises:
    (a) a first dielectric layer having a first side and a second side;
    (b) a conductive layer having a first side in contact with said second side of said first dielectric layer and a second side; and
    (c) a second dielectric layer having a first side in contact with said second side of conductive layer and a second side.

12. The probe of claim 1 wherein one of said first and said second conductive members comprises:
    (a) a contact tip; and
    (b) a substantially planar conductive shield conductively connected to said contact tip and electrically isolated from the other of said first and said second conductive members, said conductive shield coextensive with a greater area of said terminal section than an area of said contact tip.

13. A probing system comprising:
    (a) a first probe comprising:
        (i) a coaxial cable including an axially extending first conductor and a coaxial second conductor, said coaxial cable terminating in a terminal section oblique to a longitudinal axis of said coaxial cable;
        (ii) a first contact tip conductively connected to said first conductor and located nearer a periphery of said terminal section of said coaxial cable than a center of said terminal section and substantially within said periphery of said terminal section; and
        (iii) a second contact tip conductively connected to said second conductor and located nearer said periphery of said terminal section than said center of said terminal section and substantially within said periphery of said terminal section; and
    (b) a second probe comprising:
        (i) a coaxial cable including an axially extending first conductor and a coaxial second conductor, said coaxial cable terminating in a terminal section oblique to a longitudinal axis of said coaxial cable;
        (ii) a first contact tip conductively connected to said first conductor and located nearer a periphery of said terminal section of said coaxial cable than a center of said terminal section and substantially within said periphery of said terminal section; and
        (iii) a second contact tip conductively connected to said second conductor and located nearer said periphery of said terminal section than said center of said terminal section and substantially within said periphery of said terminal section, crosstalk between said second contact tip of said first probe and a contact tip of said second probe spaced 150 micrometers apart said second contact tip of said first probe on a ground being less than $-42$ dB for an applied signal frequency of 30 gigahertz.

14. The probing system of claim 13 wherein said crosstalk is less than $-47$ dB for said applied signal frequency of 30 gigahertz.

15. The probing system of claim 13 wherein said crosstalk is less than $-50$ dB for said applied signal frequency of 30 gigahertz.

16. A probe comprising:
    (a) a coaxial cable including an axially extending first conductor, a coaxial second conductor conductively connected to a ground, and a dielectric, said coaxial cable terminating in a terminal section oblique to a longitudinal axis of said coaxial cable;
    (b) a first contact located substantially within a periphery of said terminal section and conductively connected said first conductor, said first contact engageable with a device to be tested; and
    (c) a conductive member conductively connecting said second conductor to a second contact located substantially within said periphery of said terminal section, said conductive member including a substantially planar conductor located proximate to but conductively disconnected from said first contact.

17. The probe of claim 16 wherein said conductive member is located substantially within said periphery of said terminal section.

18. The probe of claim 16 further comprising a second conductive member conductively connecting said second conductor to a third contact located substantially within said periphery of said terminal section, said second conductive member including a substantially planar conductor located proximate to but conductively disconnected from said first contact.

19. The probe of claim 16 wherein said terminal section comprises an oblique substantially planar first section of said coaxial cable intersected by a second oblique section of said coaxial cable.

20. The probe of claim 19 wherein said second oblique section intersects said first section proximate said first contact.

* * * * *